US012317711B2

(12) United States Patent
Han

(10) Patent No.: US 12,317,711 B2
(45) Date of Patent: May 27, 2025

(54) DISPLAY SUBSTRATE AND MANUFACTURING METHOD THEREFOR, AND DISPLAY APPARATUS

(71) Applicant: BOE TECHNOLOGY GROUP CO., LTD., Beijing (CN)

(72) Inventor: Long Han, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/619,292

(22) PCT Filed: Feb. 8, 2021

(86) PCT No.: PCT/CN2021/075975
§ 371 (c)(1),
(2) Date: Dec. 15, 2021

(87) PCT Pub. No.: WO2022/165833
PCT Pub. Date: Aug. 11, 2022

(65) Prior Publication Data
US 2024/0049542 A1 Feb. 8, 2024

(51) Int. Cl.
*H10K 59/131* (2023.01)
*H10K 59/12* (2023.01)

(52) U.S. Cl.
CPC ..... *H10K 59/1315* (2023.02); *H10K 59/1201* (2023.02)

(58) Field of Classification Search
CPC ........... H10K 59/1315; H10K 59/1201; H10K 59/131; H10K 59/35; G09G 3/3233;
(Continued)

(56) References Cited

U.S. PATENT DOCUMENTS

2002/0075249 A1 6/2002 Kubota et al.
2017/0337873 A1* 11/2017 Kim ............... G09G 3/3233
(Continued)

FOREIGN PATENT DOCUMENTS

| CN | 111243441 | 6/2020 |
| CN | 111564120 | 8/2020 |
| KR | 20140080653 | 7/2014 |

OTHER PUBLICATIONS

PCT International Search Report and Written Opinion for corresponding PCT Application No. PCT/CN2021/075975, 9 pages.

*Primary Examiner* — Amar Movva
*Assistant Examiner* — Sandra Milena Rodriguez Villan
(74) *Attorney, Agent, or Firm* — Dority & Manning, P.A.

(57) ABSTRACT

A display substrate includes a base, and first data lines, second data lines, a plurality of sub-pixels and voltage signal lines disposed on the base. The first data lines and the second data lines are alternately arranged in a first direction. Each column of sub-pixels includes first sub-pixels and second sub-pixels that are alternately arranged in a second direction. In the column of sub-pixels, the first sub-pixels are electrically connected to a first data line located on a side of the column of sub-pixels and adjacent thereto, and the second sub-pixels are electrically connected to a second data line located on another side of the column of sub-pixels and adjacent thereto. An orthogonal projection of each voltage signal line on the base is located between orthogonal projections of a first data line and a second data line between two adjacent columns of sub-pixels on the base.

16 Claims, 28 Drawing Sheets

(58) Field of Classification Search
CPC ............. G09G 3/32; G09G 2300/0426; G09G 2300/0819; G09G 2300/0842; G09G 2300/0861; G09G 2300/0809; G09G 2310/0251; G09G 2310/0297; G09G 2320/0233; G09G 2320/045; G09G 3/3208; H01L 23/535; H01L 23/522; H01L 21/70; H01L 2221/10

See application file for complete search history.

(56) References Cited

U.S. PATENT DOCUMENTS

| | | |
|---|---|---|
| 2018/0136528 A1 | 5/2018 | Xiao et al. |
| 2018/0175135 A1 | 6/2018 | Lim et al. |
| 2019/0049806 A1* | 2/2019 | Dai .................... G09G 3/3607 |
| 2019/0181155 A1 | 6/2019 | Li et al. |
| 2019/0280076 A1 | 9/2019 | Bang et al. |
| 2020/0119126 A1 | 4/2020 | Jo et al. |
| 2020/0135830 A1 | 4/2020 | Seo et al. |
| 2021/0192987 A1 | 6/2021 | Du et al. |
| 2022/0005411 A1 | 1/2022 | Wang et al. |
| 2022/0122531 A1 | 4/2022 | Zheng |

\* cited by examiner

DISPLAY SUBSTRATE AND MANUFACTURING METHOD THEREFOR, AND DISPLAY APPARATUS

CROSS-REFERENCE TO RELATED APPLICATION

This application is a national phase entry under 35 USC 371 of International Patent Application No. PCT/CN 2021/075975 filed on Feb. 8, 2021, which is incorporated herein by reference in its entirety.

TECHNICAL FIELD

The present disclosure relates to the field of display technologies, and in particular, to a display substrate and a manufacturing method therefor, and a display apparatus.

BACKGROUND

A refresh frequency of a display apparatus (also referred to as a vertical refresh frequency or a vertical scanning frequency) refers to the number of new screens that may be displayed on a display screen per second. For example, the display screen may display 60 new screens per second at a refresh frequency of 60 Hz. In a case where the refresh frequency of the display apparatus is high, such as 75 Hz, 90 Hz, 120 Hz or higher, when the display apparatus displays a screen moving at a high speed, blurring and tailing of the screen may be avoided, thereby improving the screen quality and the user's visual experience.

SUMMARY

In an aspect, a display substrate is provided. The display substrate includes a base, a plurality of sub-pixels, a plurality of first data lines, a plurality of second data lines and a plurality of voltage signal lines disposed on the base. The plurality of sub-pixels are arranged in an array. Every two adjacent columns of sub-pixels are provided with one first data line and one second data line therebetween. Each column of sub-pixels includes a plurality of first sub-pixels and second sub-pixels, and the first sub-pixels and the second sub-pixels are alternately arranged in a second direction. The column of sub-pixels is adjacent to one first data line and one second data line in the first direction, and the first data line and the second data line are located at two sides of the column of sub-pixels. Each first sub-pixel in the column of sub-pixels is electrically connected to the first data line adjacent to the column of sub-pixels, and each second sub-pixel in the column of sub-pixels is electrically connected to the second data line adjacent to the column of sub-pixels. An orthogonal projection of each voltage signal line on the base is located between orthogonal projections of the first data line and the second data line between the two adjacent columns of sub-pixels on the base. The voltage signal line is electrically connected to at least one column of sub-pixels. The voltage signal line including a first voltage signal sub-line and a second voltage signal sub-line. The second voltage signal sub-line is disposed on a side of the first voltage signal sub-line proximate to the base, and electrically connected to the first voltage signal sub-line. The first voltage signal sub-line, the first data line and the second data line are arranged in a same layer. The first direction is a direction substantially perpendicular to an extending direction of the column of sub-pixels, and the second direction is a direction substantially parallel to the extending direction of the column of sub-pixels.

In some embodiments, each row of sub-pixels include a plurality of first sub-pixels and a plurality of second sub-pixels, and the first sub-pixels and the second sub-pixels are alternately arranged in the first direction.

In some embodiments, the display substrate further includes a first insulating layer disposed between the first voltage signal sub-line and the second voltage signal sub-line, and the first insulating layer includes a plurality of first via holes. The first voltage signal sub-line is electrically connected to the second voltage signal sub-line through at least one first via hole in the plurality of first via holes. In the first data line, the second data line and the first voltage signal sub-line that are located between the two adjacent columns of sub-pixels, a portion of the first data line adjacent to the first via hole bends in a direction away from the first via hole to form a first bent portion, and a portion of the second data line adjacent to the first via hole bends in a direction away from the first via hole to form a second bent portion. The first bent portion and the second bent portion are opposite to each other to form an accommodating region. The first voltage signal sub-line includes a conductive portion passing through the first via hole, and the conductive portion is located in the accommodating region.

In some embodiments, in the first direction, a dimension of the conductive portion is greater than a width of a portion of the first voltage signal sub-line other than the conductive portion, and a dimension of the accommodating region is greater than a distance between a portion of the first data line other than the first bent portion and a portion of the second data line other than the second bent portion between the two adjacent columns of sub-pixels.

In some embodiments, in the first direction, a distance between the conductive portion and the first bent portion is substantially equal to a distance between the conductive portion and the second bent portion.

In some embodiments, in the first direction, a distance between the conductive portion and the first bent portion is substantially equal to a distance between a portion of the first data line other than the first bent portion and a portion of the first voltage signal sub-line other than the conductive portion. And/or, in the first direction, a distance between the conductive portion and the second bent portion is substantially equal to a distance between a portion of the second data line other than the second bent portion and the portion of the first voltage signal sub-line other than the conductive portion.

In some embodiments, the display substrate further includes first connection portions. In the first data line and the second data line that are adjacent to the column of sub-pixels and located on the two sides of the column of sub-pixels in the first direction, the first bent portion and the second bent portion are provided with a first connection portion therebetween. The first connection portion and the first voltage signal sub-line are arranged in a same layer.

In some embodiments, the display substrate further includes anode layers and first light-emitting control transistors disposed on the base. The anode layers are disposed on a side of the first connection portion away from the base. A first light-emitting control transistor in the first light-emitting control transistors includes an active layer including a first conductor portion. The first connection portion is electrically connected to the first conductor portion and an anode layer in the anode layers.

In some embodiments, the display substrate further includes second connection portions. A second connection portion in the second connection portions is disposed between the active layer of the first light-emitting control transistor and the first connection portion, and arranged in a same layer as the second voltage signal sub-line. The second connection portion is electrically connected to the first conductor portion and the first connection portion.

In some embodiments, in the second direction, a dimension of the first connection portion is greater than or equal to both a length of the first bent portion and a length of the second bent portion.

In some embodiments, an orthogonal projection of the first connection portion on the base and an orthogonal projection of the second connection portion on the base have an overlapped region therebetween.

In some embodiments, the first via hole is located between two adjacent rows of sub-pixels and between two adjacent columns of sub-pixels.

In some embodiments, in a case where the display substrate further includes the first connection portion, in the second direction, maximum dimensions of two portions of the first connection portion located on two sides of a line connecting centers of two first via holes adjacent to the first connection portion are substantially equal.

In some embodiments, each sub-pixel includes a second light-emitting control transistor and a capacitor. The second voltage signal sub-line is electrically connected to an active layer of the second light-emitting control transistor. The capacitor includes a first electrode plate located on a side of a film layer where the second voltage signal sub-line is located proximate to the base and a second electrode plate located on a side of the first electrode plate proximate to the base. The second voltage signal sub-line is further electrically connected to the first electrode plate.

In some embodiments, in each row of sub-pixels, first electrode plates of capacitors in a plurality of sub-pixels are electrically connected to each other, so as to form a plurality of auxiliary conductive strips extending in the first direction. Orthogonal projections of the plurality of auxiliary conductive strips and a plurality of first voltage signal sub-lines on the base intersect to form a grid structure.

In another aspect, a display apparatus including the display substrate described above is provided.

In yet another aspect, a manufacturing method of a display substrate is provided. The manufacturing method includes: providing a base; forming pixel driving circuits in a plurality of sub-pixels arranged in an array on the base, each column of sub-pixels including a plurality of first sub-pixels and a plurality of second sub-pixels, and the first sub-pixels and the second sub-pixels being alternately arranged in a second direction; forming a plurality of second voltage signal sub-lines on a side of the pixel driving circuits in the plurality of sub-pixels away from the base, each second voltage signal sub-line being located between two adjacent columns of sub-pixels; forming a plurality of first data lines, a plurality of second data lines and a plurality of first voltage signal sub-lines on a side of the plurality of second voltage signal sub-lines away from the base. A first voltage signal sub-line and a second voltage signal sub-line form a voltage signal line. Each voltage signal line is electrically connected to pixel driving circuits in at least one column of sub-pixels. Each voltage signal line is located between the two adjacent columns of sub-pixels. The first data lines and the second data lines are alternately arranged in a first direction. The column of sub-pixels is adjacent to one first data line and one second data line in the first direction, and the first data line and the second data line are located on two sides of the column of sub-pixels. A pixel driving circuit in each first sub-pixel in the column of sub-pixels is electrically connected to the first data line adjacent to the column of sub-pixels, and a pixel driving circuit in each second sub-pixel in the column of sub-pixels is electrically connected to the second data line adjacent to the column of sub-pixels. The first direction is a direction substantially perpendicular to an extending direction of the column of sub-pixels, and the second direction is a direction substantially parallel to the extending direction of the column of sub-pixels.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

DETAILED DESCRIPTION

Figure 1:
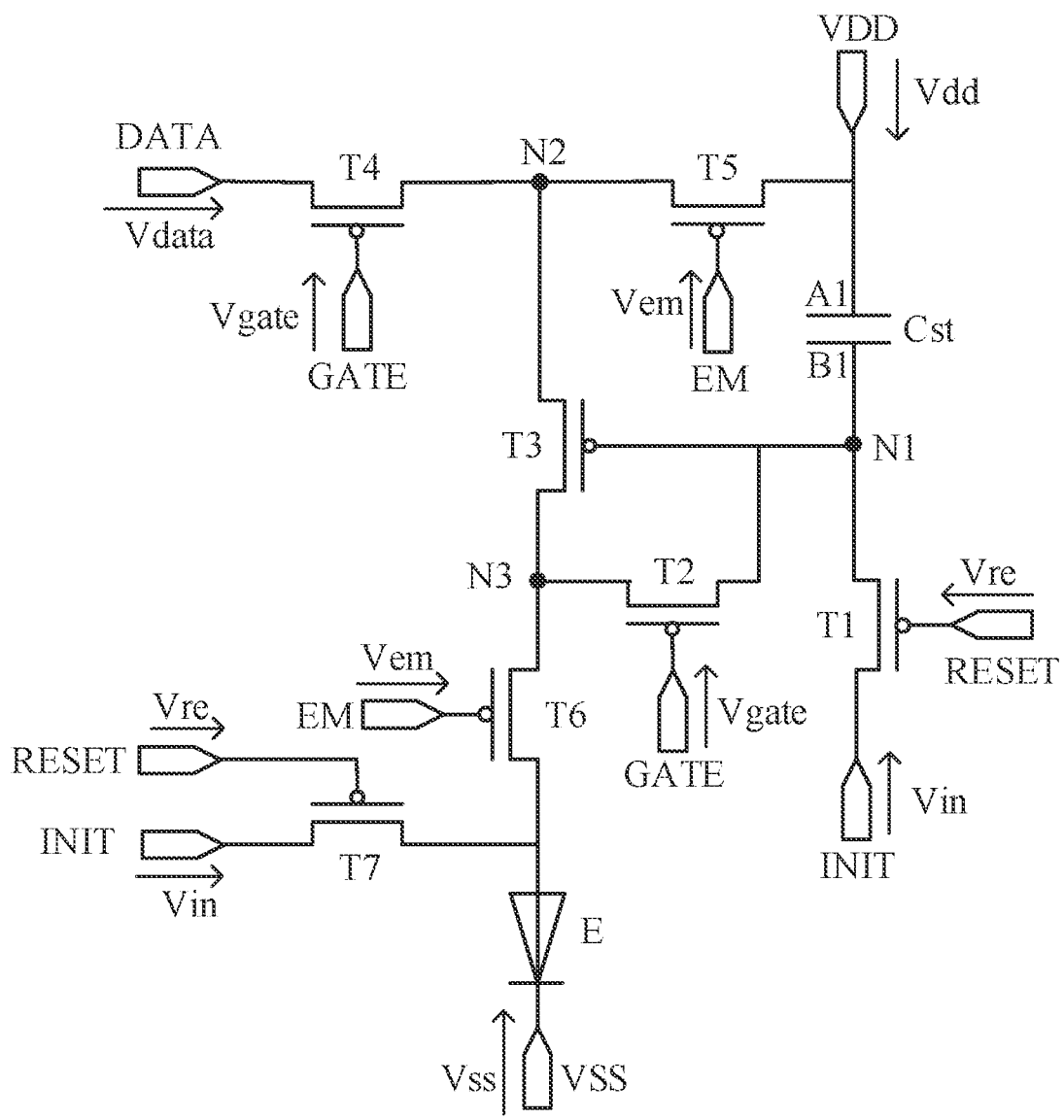
FIG. 1 is an equivalent circuit diagram of a pixel driving circuit of 7T1C, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "an example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms such as "coupled", "connected" and their derivatives may be used. For example, the term "connected" may be used in the description of some embodiments to indicate that two or more components are in direct physical or electrical contact with each other or that two or more components are in indirect physical or electrical connection with each other.

It will be understood that in the description of the present disclosure, orientations or positional relationships indicated by the terms such as "center", "upper", "lower", "front", "rear", "left", "right", "vertical", "horizontal", "top", "bottom", "inner", "outer" are based on orientations or positional relationships shown in the drawings. These terms are merely for the convenience of describing the present disclosure and to simplify the description, and do not indicate or imply that the indicated apparatus or element must have a particular orientation, or must be constructed or operated in a particular orientation, and therefore should not be construed as limiting the present disclosure.

The phrase "at least one of A, B and C" has a same meaning as the phrase "at least one of A, B or C", both including the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The term such as "about" or "substantially" as used herein includes a stated value and an average value within an acceptable range of deviation of a particular value determined by a person of ordinary skill in the art, considering measurement in question and errors associated with measurement of a particular quantity (i.e., limitations of a measurement system).

In addition, the term "a plurality of/the plurality of" in the present disclosure means two or more in number.

When a display apparatus operates at a high refresh frequency (e.g., 75 Hz, 90 Hz, 120 Hz or higher), the displayed screen quality and the user's visual experience may be improved. However, the high refresh frequency causes a problem of shortening data writing and compensation time of sub-pixels in the display apparatus, which may result in an insufficient charging rate of the sub-pixels and a decrease in threshold voltage compensation effect, thereby reducing the display effect of the display apparatus.

As shown in FIG. 1, in an example where the display apparatus includes a pixel driving circuit of a 7T1C structure, the display apparatus includes a plurality of sub-pixels, and each sub-pixel has the pixel driving circuit of the 7T1C structure. The pixel driving circuit includes seven transistors (a first transistor T1 to a seventh transistor T7) and a capacitor Cst. The seven transistors may be P-type transistors, which are turned on when receiving signals at low levels and turned off when receiving signals at high levels at respective gates. The seven transistors may also be N-type transistors, which are turned on when receiving signals at high levels and turned off when receiving signals at low levels at respective gates.

For the convenience of introducing the pixel driving circuit of 7T1C, a point at which a second electrode of the first transistor T1, a second electrode plate B1 of the capacitor Cst and a gate of the third transistor T3 are electrically connected is referred to as a first node N1. Voltages of the first node N1, the second electrode plate B1 of the capacitor Cst and the gate of the third transistor T3 are equal. A point at which a second electrode of the fifth transistor T5, a second electrode of the fourth transistor T4 and a first electrode of the third transistor T3 are electrically connected is referred to as a second node N2. A point at which a second electrode of the third transistor T3, a first electrode of the second transistor T2 and a first electrode of the sixth transistor T6 are electrically connected is referred to as a third node N3.

It will be noted that a channel width to length ratio of a driving transistor is generally greater than a channel width to length ratio of other transistor as a switching transistor. That is, a channel width to length ratio of the third transistor T3 is generally greater than channel width to length ratios of the first transistor T1, the second transistor T2, the fourth transistor T4, the fifth transistor T5, the sixth transistor T6 and the seventh transistor T7. In addition, considering an electroluminescent device as an example, a luminance of a light-emitting device E corresponding to each sub-pixel is related to a magnitude of a driving current I flowing therethrough. According to the formula $I=K(Vgs-Vth)^2$, it can be seen that the driving current I is related to a voltage difference Vgs between a source and a gate of the driving transistor and a threshold voltage Vth of the driving transistor. That is, in a case where the voltage difference Vgs is constant, the luminance of each light-emitting device E is mainly affected by a threshold voltage Vth of a corresponding driving transistor. In this way, when the threshold voltages Vth of the driving transistors in the sub-pixels in the display apparatus are not equal, for example, when the threshold voltage Vth of the driving transistor drifts as the operating time increases, the display apparatus may exhibit an uneven display luminance.

Components of the pixel driving circuit of 7T1C and connection relationships between the components will be introduced below. Here, as an example, the transistors included in the pixel driving circuit are P-type transistors.

That is, the first transistor T1 to the seventh transistor T7 are turned on when signals received at respective gates are at low levels, and are turned off when signals received at respective gates are at high levels.

A gate of the first transistor T1 is electrically connected to a reset signal terminal RESET, a first electrode of the first transistor T1 is electrically connected to an initialization voltage signal terminal INIT, and the second electrode of the first transistor T1 is electrically connected to the first node N1. A gate of the second transistor T2 is electrically connected to a scan signal terminal GATE, the first electrode of the second transistor T2 is electrically connected to the third node N3, and a second electrode of the second transistor T2 is electrically connected to the first node N1. The gate of the third transistor T3 is electrically connected to the first node N1, the first electrode of the third transistor T3 is electrically connected to the second node N2, and the second electrode of the third transistor T3 is electrically connected to the third node N3. A gate of the fourth transistor T4 is electrically connected to the scan signal terminal GATE, a first electrode of the fourth transistor T4 is electrically connected to a data signal terminal DATA, and the second electrode of the fourth transistor T4 is electrically connected to the second node N2. A gate of the fifth transistor T5 is electrically connected to a light-emitting signal terminal EM, a first electrode of the fifth transistor T5 is electrically connected to a first voltage signal terminal VDD, and the second electrode of the fifth transistor T5 is electrically connected to the second node N2. A gate of the sixth transistor T6 is electrically connected to the light-emitting signal terminal EM, the first electrode of the sixth transistor T6 is electrically connected to the third node N3, and a second electrode of the sixth transistor T6 is electrically connected to an anode of the light-emitting device E in the sub-pixel. A gate of the seventh transistor T7 is electrically connected to the reset signal terminal RESET, a first electrode of the seventh transistor T7 is electrically connected to the initialization voltage signal terminal INIT, and a second electrode of the seventh transistor T7 is electrically connected to the anode of the light-emitting device E in the sub-pixel. A first electrode plate A1 of the capacitor Cst is electrically connected to the first voltage signal terminal VDD, and the second electrode plate B1 of the capacitor Cst is electrically connected to the first node N1.

In addition, the anode of the light-emitting device E in the sub-pixel is electrically connected to the pixel driving circuit, and a cathode of the light-emitting device E is electrically connected to a second voltage signal terminal VSS.

Figure 2:
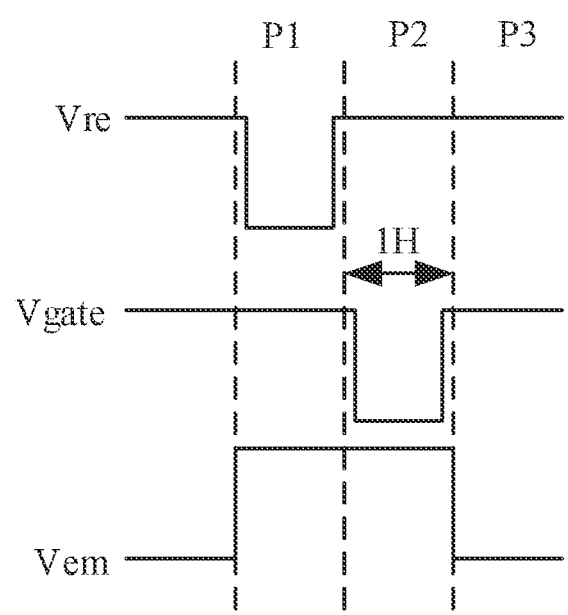
FIG. 2 is a signal timing diagram for the pixel driving circuit shown in FIG. 1.

An operation process of the pixel driving circuit of 7T1C will be introduced below in combination with the signal timing diagram shown in FIG. 2. During a frame time, the operation process of the pixel driving circuit includes a reset phase P1, a writing and compensation phase P2 and a light-emitting phase P3.

In the reset phase P1, a reset signal Vre of the reset signal terminal RESET transmitted to the gate of the first transistor T1 and the gate of the seventh transistor T7 is at a low level, so that the first transistor T1 and the seventh transistor T7 are turned on. The first transistor T1 transmits an initialization voltage signal Vin from the initialization voltage signal terminal INIT to the first node N1 to reset the voltages of the second electrode plate B1 of the capacitor Cst and the gate of the third transistor T3 (also referred to as a driving transistor T3), and the voltage of the second electrode plate B1 is equal to a voltage Vi of the initialization voltage signal Vin. The seventh transistor T7 transmits the initialization voltage signal Vin from the initialization voltage signal terminal INIT to the anode of the light-emitting device E to reset a voltage of the anode of the light-emitting device E.

Here, the initialization voltage signal Vin is at a low level in the reset phase P1, and the voltage of the first node N1 is a low voltage, so that the third transistor T3 whose gate is electrically connected to the first node N1 is turned on. For example, the initialization voltage signal Vin may be a constant low voltage signal.

In the writing and compensation phase P2, the reset signal Vre is at a high level, so that the first transistor T1 and the seventh transistor T7 are turned off. The voltage of the first node N1 is equal to the voltage of the second electrode plate B1 of the capacitor Cst. That is, the voltage of the first node N1 is still a low voltage, and the third transistor T3 is maintained in an on state.

A scanning signal Vgate of the scan signal terminal GATE transmitted to the gate of the fourth transistor T4 (may be referred to as a writing transistor T4) and the gate of the second transistor T2 (may be referred to as a compensation transistor T2) is at a low level, so that the fourth transistor T4 and the second transistor T2 are turned on. The fourth transistor T4 transmits a data signal Vdata from the data signal terminal DATA to the third transistor T3. The data signal Vdata is transmitted to the second transistor T2 through the turned-on third transistor T3, and then transmitted to the first node N1 through the turned-on second transistor T2, so as to be written to the capacitor Cst. The process of writing the data signal Vdata to the capacitor Cst is actually a charging process of the second electrode plate B1 of the capacitor Cst (i.e., a process of gradually increasing the voltage of the second electrode plate B1). The voltage of the first node N1 gradually increases from Vi in the previous phase (i.e., the reset phase P1) until the voltage of the first node N1 increases to a sum of Vdata' and Vth (i.e., Vdata'+Vth), and the third transistor T3 is turned off. Here, Vdata' is a voltage of the data signal, and Vth is a threshold voltage value of the third transistor T3. In this case, the voltage of the second electrode plate B1 of the capacitor Cst is equal to (Vdata'+Vth), and thus the threshold voltage value Vth of the third transistor T3 is compensated to the data signal written to the capacitor Cst.

It will be noted that a duration 1H of an effective level (i.e., a level at which a corresponding transistor is turned on) of the scanning signal Vgate is time required for the data signal Vdata to be written to sub-pixels in a row.

In the light-emitting phase P3, a light-emitting signal Vem of the light-emitting signal terminal EM transmitted to the gate of the fifth transistor T5 and the gate of the sixth transistor T6 is at a low level, so that the fifth transistor T5 and the sixth transistor T6 are turned on. A source voltage Vs of the third transistor T3 is equal to a first voltage Vdd' of the first voltage signal terminal VDD, and a gate voltage Vg of the third transistor T3 is equal to (Vdata'+Vth). Here, the first voltage Vdd' is greater than (Vdata'+Vth), so that the third transistor T3 is turned on. In this way, a current path is formed between the first voltage signal terminal VDD and the second voltage signal terminal VSS, so that the light-emitting device E may emit light.

It will be noted that the driving current I flowing through the light-emitting device E in the light-emitting phase P3 is equal to $K(Vgs-Vth)^2$, i.e., equal to $K(Vdata'+Vth-Vdd'-Vth)^2$, and thus equal to $K(Vdata'-Vdd')^2$ (i.e., $I=K(Vgs-Vth)^2=K(Vdata'+Vth-Vdd'-Vth)^2=K(Vdata'-Vdd')^2$). In this way, the magnitude of the driving current I is irrelevant to the threshold voltage value Vth of the third transistor T3, thereby avoiding an influence of a threshold voltage drift of the third transistor T3 on the driving current I, and making luminances of the sub-pixels in the display apparatus uniform.

In a case where the display apparatus is required to be refreshed at a high frequency, since the number of new screens displayed per second is large, time of each frame of screen is shortened, resulting in a correspondingly shortened writing and compensation phase P2 within a frame, i.e., resulting in a shortened duration of the effective level of the scanning signal. This may cause data writing (i.e., charging) and threshold voltage compensation time of the sub-pixels in the display apparatus to be short, thereby causing an insufficient charging rate of the sub-pixels and a poor threshold voltage compensation effect, which affect the screen quality of the display apparatus and the user's visual experience.

In view of the above problem, a driving method in which two data lines DL are provided to supply the data signal Vdata to sub-pixels in a column may be used to solve the problem. A scheme of this driving method used in the display apparatus with the pixel driving circuit of 7T1C will be exemplarily introduced below with reference to FIGS. 3 to 6.

Figure 3:
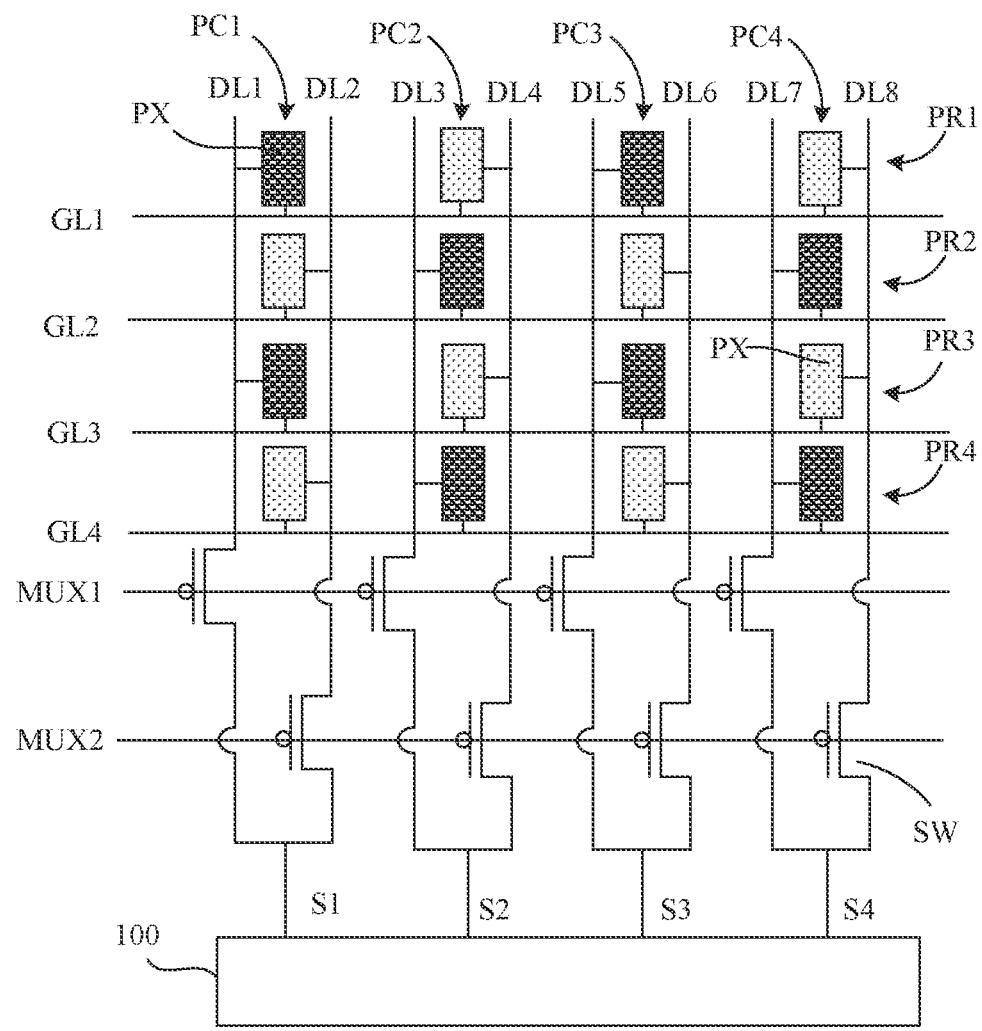
FIG. 3 is a schematic structural diagram of a driving architecture, in accordance with some embodiments.
Figure 5:
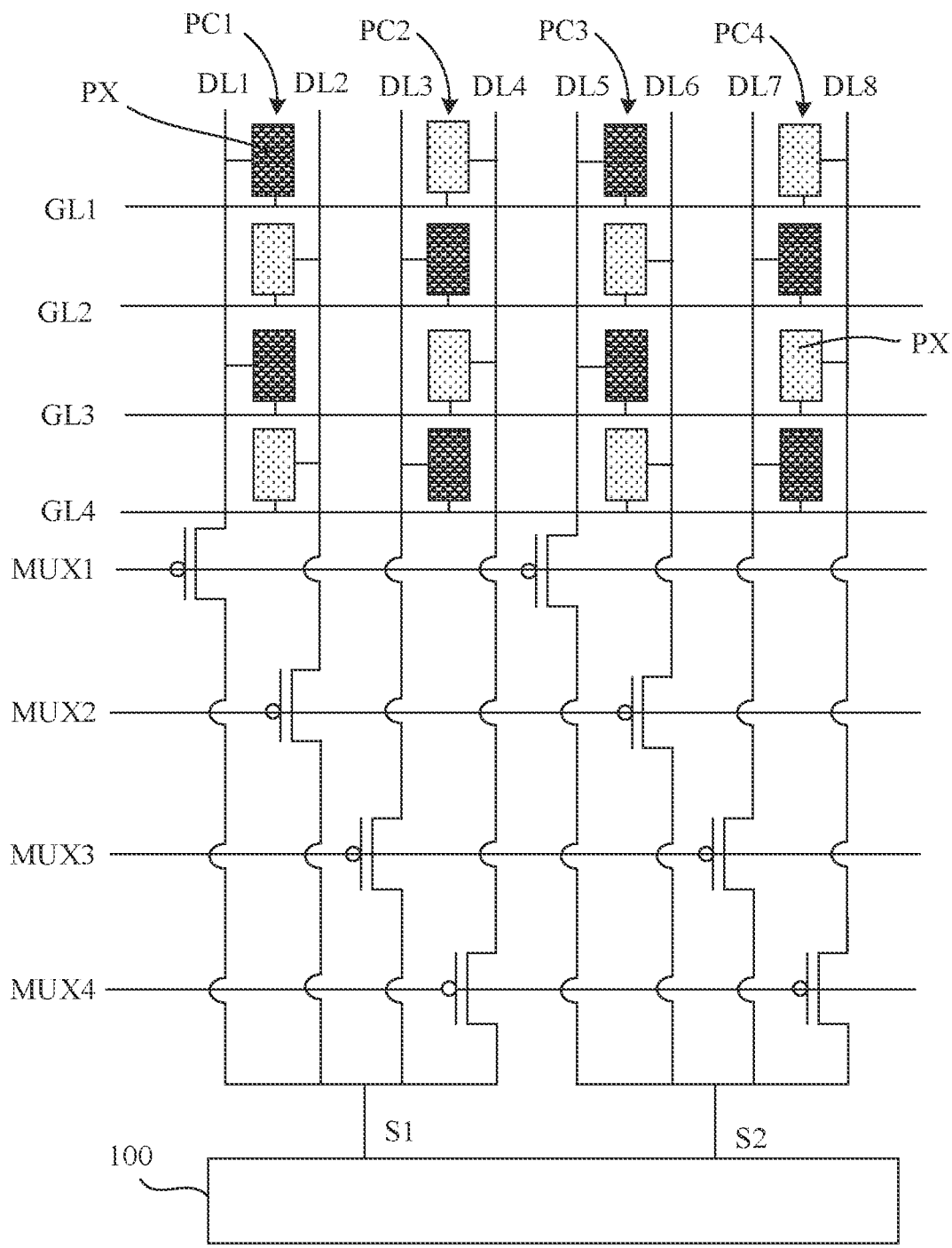
FIG. 5 is a schematic structural diagram of another driving architecture, in accordance with some embodiments.

As shown in FIGS. 3 and 5, the display apparatus includes a plurality of sub-pixels PX, a plurality of data lines DL and a plurality of gate lines GL (e.g., GL1 to GL4), and these sub-pixels PX may be arranged in an array. Each column of sub-pixels corresponds to two of the data lines DL (e.g., DL1 to DL8), and the two data lines DL are respectively disposed at left and right sides of the column of sub-pixels. In the same column of sub-pixels, every two adjacent sub-pixels PX are electrically connected to the data lines DL at the left and right sides. That is, the sub-pixels PX in the same column are alternately electrically connected to the data lines DL at the left and right sides in an extending direction of this column of sub-pixels. The same row of sub-pixels may be electrically connected to a same gate line GL. Here, the gate line GL may provide the scanning signal Vgate to sub-pixels in a row electrically connected thereto, so that the data signal Vdata from the data line DL is transmitted to a corresponding sub-pixel PX, so as to write the data signal Vdata thereto. A data writing process of each sub-pixel PX may be referred to the description of the above writing and compensation phase P2, which will not be repeated here.

It will be noted that in an extending direction of each row of sub-pixels, the sub-pixels PX in the same row may be alternately electrically connected to data lines DL at left sides of the sub-pixels PX and data lines DL at right sides of the sub-pixels PX (as shown in FIGS. 3 and 5), or may be electrically connected to data lines DL at respective left or right sides.

The display apparatus may further include a plurality of source driving signal lines S (e.g., S1 to S4) and a source driver 100. The plurality of source driving signal lines S are electrically connected to the source driver 100. The source driver 100 is used to provide the data signal Vdata of an image to be displayed by the display apparatus, and the data signal Vdata may be provided to the sub-pixels PX through the source driving signal lines S and the data lines DL.

A plurality of adjacent data lines DL are electrically connected to a same source driving signal line S, so that the source driver 100 may transmit the data signal Vdata to the plurality of data lines DL electrically connected to the source driving signal line S through the source driving signal line S, so as to reduce the number of interfaces disposed on the source driver 100 for outputting the data signal Vdata. Each data line DL and the source driving signal line S corresponding thereto are provided with a switch SW therebetween, so that the source driving signal line S may be time-division multiplexed by controlling the on or off of a corresponding switch SW. Here, a control electrode of the switch SW corresponding to the data line DL that corresponds to a same source driving signal line S and is located at the same side of sub-pixels in a column is electrically connected to a same control signal line MUX (e.g., MUX1 or MUX2 in FIG. 3). The on or off of the switch SW corresponding to the data line DL may be controlled through the control signal line MUX, thereby controlling the data signal Vdata from the source driving signal line S to be transmitted to a specific data line DL within a certain frame, and thus the data signal Vdata may be controlled to be written to a corresponding sub-pixel PX.

Here, the switch SW may include an N-type or a P-type transistor. In a case where the switch SW includes the N-type transistor, the switch SW is turned on when a signal from the control signal line MUX is at a high level, and is turned off when this signal is at a low level. In a case where the switch SW includes the P-type transistor, the switch SW is turned on when the signal from the control signal line MUX is at a low level, and is turned off when this signal is at a high level.

The driving process of the display apparatus will be introduced below considering the structure of the display apparatus shown in FIG. 3 or 5 as an example. The pixel driving circuit in the sub-pixel in the display apparatus may be referred to FIG. 1. Here, as an example, the second transistor T2 and the fourth transistor T4 in the pixel driving circuit and the switch SW are P-type transistors, and the sub-pixels PX in the same row are alternately electrically connected to the data lines DL at respective left and right sides in the extending direction of the row of the sub-pixels.

In some examples, referring to FIG. 3, every two adjacent data lines DL are electrically connected to a same source driving signal line S. For example, the source driving signal line S1 is electrically connected to the data line DL1 and the data line DL2. That is, the source driver 100 may provide the data signal Vdata to sub-pixels in a first column PC1 through the source driving signal line S1, the data line DL1 and the data line DL2. Similarly, the source driving signal line S2 is electrically connected to the data line DL3 and the data line DL4, and the source driver 100 may provide the data signal Vdata to sub-pixels in a second column PC2 through the source driving signal line S2, the data line DL3 and the data line DL4. The source driving signal line S3 is electrically connected to the data line DL5 and the data line DL6, and the source driver 100 may provide the data signal Vdata to sub-pixels in a third column PC3 through the source driving signal line S3, the data line DL5 and the data line DL6. The source driving signal line S4 is electrically connected to the data line DL7 and the data line DL8, and the source driver 100 may provide the data signal Vdata to sub-pixels in a fourth column PC4 through the source driving signal line S4, the data line DL7 and the data line DL8.

In the two data lines DL corresponding to the same source driving signal line S, in the switch SW electrically connected to each data line DL at the left side of a corresponding column of sub-pixels, a gate of a thin film transistor is electrically connected to the control signal line MUX1. In the switch SW corresponding to each data line DL at the right side of a corresponding column of sub-pixels, a gate of a thin film transistor is electrically connected to the control signal line MUX2. For example, the gates of the thin film transistors in the switches SW electrically connected to the data lines DL1, DL3, DL5, and DL7 are all electrically connected to the control signal line MUX1, and the gates of the thin film transistors in the switches SW corresponding to the data lines DL2, DL4, DL6, and DL8 are all electrically connected to the control signal line MUX2.

Therefore, by transmitting signals at different levels to the thin film transistors in different switches SW, different data lines DL may be gated to transmit the data signals Vdata to corresponding sub-pixels PX. In this way, the source driver 100 may transmit the data signal Vdata to the two data lines DL electrically connected to the source driving signal line S through this source driving signal line S.

Figure 4:
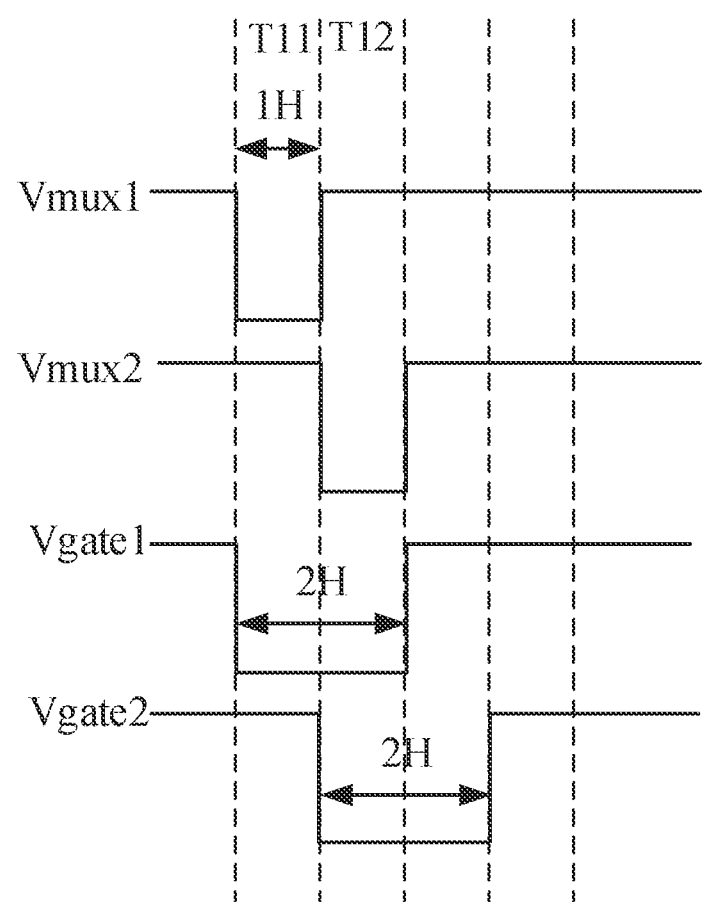
FIG. 4 is a signal timing diagram for the driving architecture shown in FIG. 3.

In this case, referring to FIG. 4, in a first phase T11, a control signal Vumx1 transmitted through the control signal line MUX1 is at a low level, so that the thin film transistors in the switches SW electrically connected to the control signal line MUX1 are turned on. A control signal Vumx2 transmitted through the control signal line MUX2 is at a high level, so that the thin film transistors in the switches SW electrically connected to the control signal line MUX2 are turned off. A scanning signal Vgate1 transmitted through the gate line GL1 is at a low level, so that the second transistors T2 and the fourth transistors T4 in sub-pixels PX in a first row PR1 are turned on. A scanning signal Vgate2 transmitted through the gate line GL2 is at a high level, so that the second transistors T2 and the fourth transistors T4 in sub-pixels PX in a second row PR2 are turned off. In this way, the data signal Vdata transmitted through the source driving signal line S1 is written to a sub-pixel in the first row PR1 and the first column PC1, and the data signal Vdata transmitted through the source driving signal line S3 is written to a sub-pixel in the first row PR1 and the third column PC3.

In a second phase T12, the control signal Vumx1 transmitted through the control signal line MUX1 is at a high level, so that the thin film transistors in the switches SW electrically connected to the control signal line MUX1 are turned off. The control signal Vumx2 transmitted through the control signal line MUX2 is at a low level, so that the thin film transistors in the switches SW electrically connected to the control signal line MUX2 are turned on. The scanning signal Vgate1 transmitted through the gate line GL1 and the scanning signal Vgate2 transmitted through the gate line GL2 are at low levels, so that the second transistors T2 and the fourth transistors T4 in sub-pixels PX in the first row PR1 and the second row PR2 are all turned on. In this way, although the second transistors T2 and the fourth transistors T4 in the sub-pixels in the first row PR1 and the sub-pixels in the second row PR2 are all turned on, since the thin film transistors in the switches SW corresponding to the data lines DL1, DL3, DL5, and DL7 are all turned off, the data signal Vdata transmitted through the source driving signal line S1 is written to a sub-pixel in the second row PR2 and the first column PC1 through the data line DL2, the data signal Vdata transmitted through the source driving signal line S2 is written to a sub-pixel in the first row PR1 and the second column PC2 through the data line DL4, the data signal Vdata transmitted through the source driving signal line S3 is written to a sub-pixel in the second row PR2 and the third column PC3 through the data line DL6, and the data signal Vdata transmitted through the source driving signal line S4 is written to a sub-pixel in the first row PR1 and the fourth column PC4 through the data line DL8.

It will be noted that in the above driving method, the duration of the effective level of the scanning signal Vgate in the sub-pixel PX is 2H. That is, the duration of the effective level of the scanning signal Vgate in the sub-pixel PX is equal to time required for the data signal Vdata to be written to sub-pixels in two rows. In this way, a duration of the writing and compensation phase P2 may be increased, so as to make the charging time of the sub-pixels PX sufficient and improve the threshold voltage compensation effect, so that the display effect of the display apparatus at a high refresh frequency may be improved.

In some embodiments, referring to FIG. 5, every four adjacent data lines DL are electrically connected to a same source driving signal line S. For example, a source driving signal line S1 is electrically connected to the data lines DL1 to DL4, and a source driving signal line S2 is electrically connected to the data lines DL5 to DL8.

In every 4 data lines DL corresponding to a same source driving signal line S from left to right in the extending direction of the sub-pixels in the row, the gate of the thin film transistor in the switch SW electrically connected to each data line DL numbered 1 is electrically connected to a control signal line MUX1, the gate of the thin film transistor in the switch SW electrically connected to each data line DL numbered 2 is electrically connected to a control signal line MUX2, the gate of the thin film transistor in the switch SW electrically connected to each data line DL numbered 3 is electrically connected to a control signal line MUX3, and the gate of the thin film transistor in the switch SW electrically connected to each data line DL numbered 4 is electrically connected to a control signal line MUX4.

Similarly, by transmitting signals at different levels to the thin film transistors in different switches SW, different data lines DL may be gated to transmit the data signals Vdata to corresponding sub-pixels PX. In this way, by multiplexing the source driving signal line S in a time-division manner, the source driver 100 may transmit the data signal Vdata to the four data lines DL electrically connected to the source driving signal line S through the same source driving signal line S, so as to write the data signal Vdata to corresponding sub-pixels in four columns.

Figure 6:
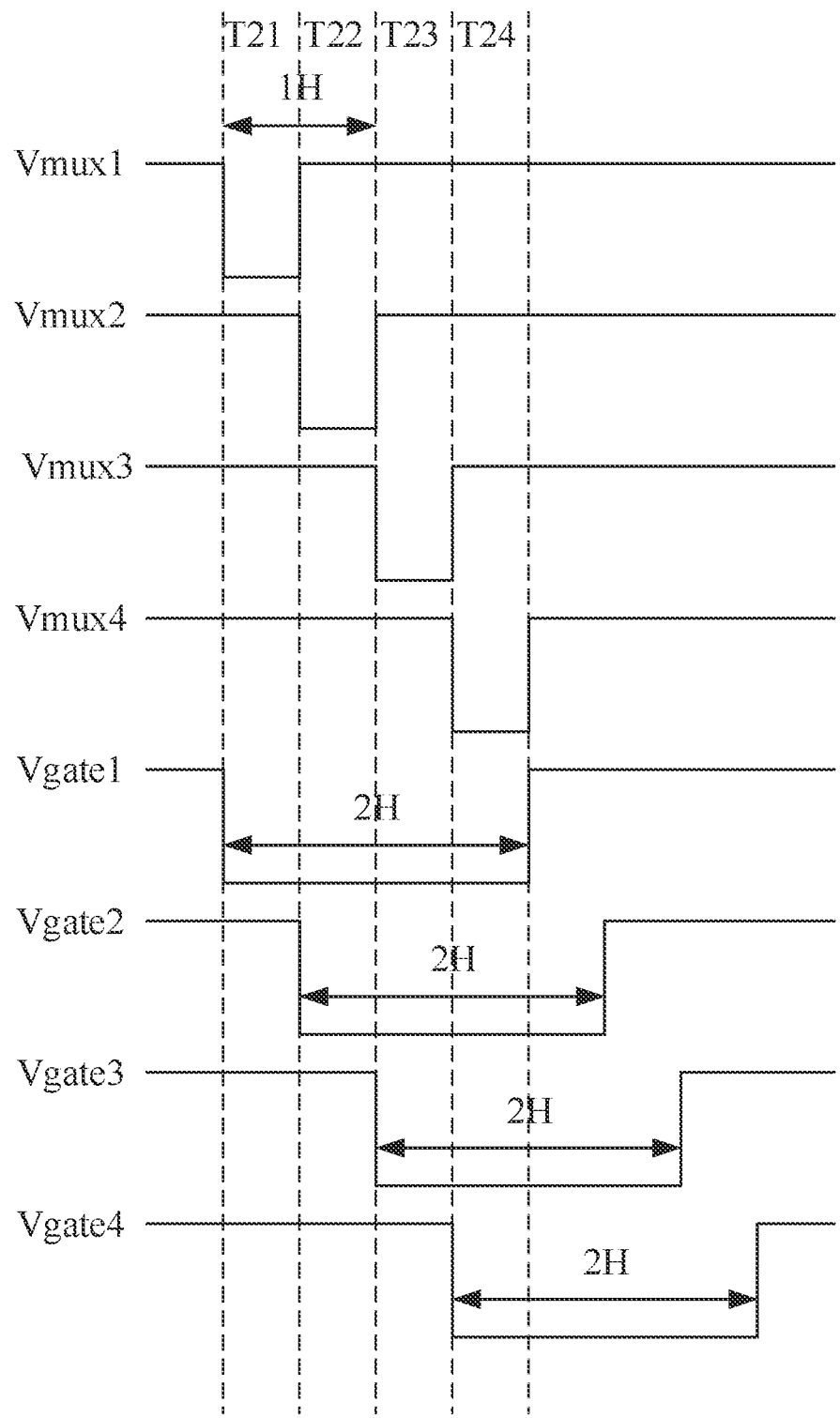
FIG. 6 is a signal timing diagram for the driving architecture shown in FIG. 5.

In this case, referring to FIG. 6, in a first phase T21, a control signal Vumx1 transmitted through the control signal line MUX1 is at a low level, so that the thin film transistors in the switches SW electrically connected to the control signal line MUX1 are turned on. Control signals Vumx2 to Vumx4 respectively transmitted through the control signal lines MUX2 to MUX4 are at high levels, so that the thin film transistors in the switches SW electrically connected to the control signal lines MUX2 to MUX4 are all turned off. A scanning signal Vgate1 transmitted through the gate line GL1 is at a low level, so that the second transistors T2 and the fourth transistors T4 in the sub-pixels PX in the first row PR1 are turned on. Scanning signals Vgate2 to Vgate4 respectively transmitted through the gate lines GL2 to GL4 are at high levels, so that the second transistors T2 and the fourth transistors T4 in sub-pixels PX in the second row PR2 to a fourth row PR4 are turned off. In this way, the data signal Vdata transmitted through the source driving signal line S1 is written to the sub-pixel in the first row PR1 and the first column PC1, and the data signal Vdata transmitted through the source driving signal line S2 is written to the sub-pixel in the first row PR1 and the third column PC3.

In a second phase T22, the control signal Vumx2 transmitted through the control signal line MUX2 is at a low level, so that the thin film transistors in the switches SW electrically connected to the control signal line MUX2 are turned on. The control signals Vumx1, Vumx3 and Vumx4 respectively transmitted through the control signal lines MUX1, MUX3 and MUX4 are at high levels, so that the thin film transistors in the switches SW electrically connected to the control signal lines MUX1, MUX3 and MUX4 are all turned off. The scanning signals Vgate1 and Vgate2 respectively transmitted through the gate lines GL1 and GL2 are at low levels, so that the second transistors T2 and the fourth transistors T4 in the sub-pixels PX in the first row PR1 and in the second row PR2 are turned on. The scanning signals Vgate3 and Vgate4 respectively transmitted through the gate lines GL3 and GL4 are at high levels, so that the second transistors T2 and the fourth transistors T4 in sub-pixels PX in a third row PR3 and a fourth row PR4 are all turned off. In this way, the data signal Vdata transmitted through the source driving signal line S1 is written to the sub-pixel in the second row PR2 and the first column PC1, and the data signal Vdata transmitted through the source driving signal line S2 is written to the sub-pixel in the second row PR2 and the third column PC3.

In a third phase T23, the control signal Vumx3 transmitted through the control signal line MUX3 is at a low level, so that the thin film transistors in the switches SW electrically connected to the control signal line MUX3 are turned on. The control signals Vumx1, Vumx2, and Vumx4 respectively transmitted through the control signal lines MUX1, MUX2, and MUX4 are at high levels, so that the thin film transistors in the switches SW electrically connected to the control signal lines MUX1, MUX2, and MUX4 are all turned off. The scanning signals Vgate1 to Vgate3 respectively transmitted through the gate lines GL1 to GL3 are at low levels, so that the second transistors T2 and the fourth transistors T4 in sub-pixels PX in the first row PR1 to the third row PR3 are turned on. The scanning signal Vgate4 transmitted through the gate line GL4 is at a high level, so that the second transistors T2 and the fourth transistors T4 in the sub-pixels PX in the fourth row PR4 are turned off. In this way, the data signal Vdata transmitted through the source driving signal line S1 is written to a sub-pixel in the second row PR2 and the second column PC2, and the data signal Vdata transmitted through the source driving signal line S2 is written to a sub-pixel in the second row PR2 and the fourth column PC4.

In a fourth phase T24, the control signal Vumx4 transmitted through the control signal line MUX4 is at a low level, so that the thin film transistors in the switches SW electrically connected to the control signal line MUX4 are turned on. The control signals Vumx1 to Vumx3 respectively transmitted through the control signal lines MUX1 to MUX3 are at high levels, so that the thin film transistors in the switches SW electrically connected to the control signal lines MUX1 to MUX3 are all turned off. The scanning signals Vgate1 to Vgate4 respectively transmitted through the gate lines GL1 to GL4 are at low levels, so that the second transistors T2 and the fourth transistors T4 in sub-pixels PX in the first row PR1 to the fourth row PR4 are all turned on. In this way, the data signal Vdata transmitted through the source driving signal line S1 is written to the sub-pixel in the first row PR1 and the second column PC2 and a sub-pixel in the third row PR3 and the second column PC2. The data signal Vdata transmitted through the source driving signal line S2 is written to a sub-pixel in the first row PR1 and the fourth column PC4 and a sub-pixel in the third row PR3 and the fourth column PC4.

Here, the duration of the effective level of the scanning signal Vgate in the sub-pixel PX is 2H, and the duration of the writing and compensation phase P2 may also be increased, so as to make the charging time of the sub-pixels PX sufficient and improve the threshold voltage compensation effect, so that the display effect of the display apparatus at a high refresh frequency may be improved.

It will be noted that in the fourth phase T24, the data signal Vdata written to the sub-pixel in the third row PR3 and the second column PC2 and the sub-pixel in the third row PR3 and the fourth column PC4 is not an actually required data signal in the light-emitting phase. When the duration of the effective level of the scanning signal is 2H, before the effective level of the scanning signal Vgate3 corresponding to the above two sub-pixels ends, a new data signal Vdata, which is the required data signal in the light-emitting phase, is further written to the two sub-pixels.

However, in the case where the driving method in which the data signal Vdata is supplied to the sub-pixels in the column through two data lines DL is used in the display apparatus, the number of data lines DL disposed in the display apparatus is doubled, so that a distance between the data lines DL becomes small, which may result in a large parasitic capacitance between adjacent data lines DL. The large parasitic capacitance causes a crosstalk between the data signals Vdata transmitted by adjacent data lines DL, which affects the data writing of the sub-pixels and the threshold voltage compensation, thereby possibly reducing the display effect of the display apparatus.

Figure 7:
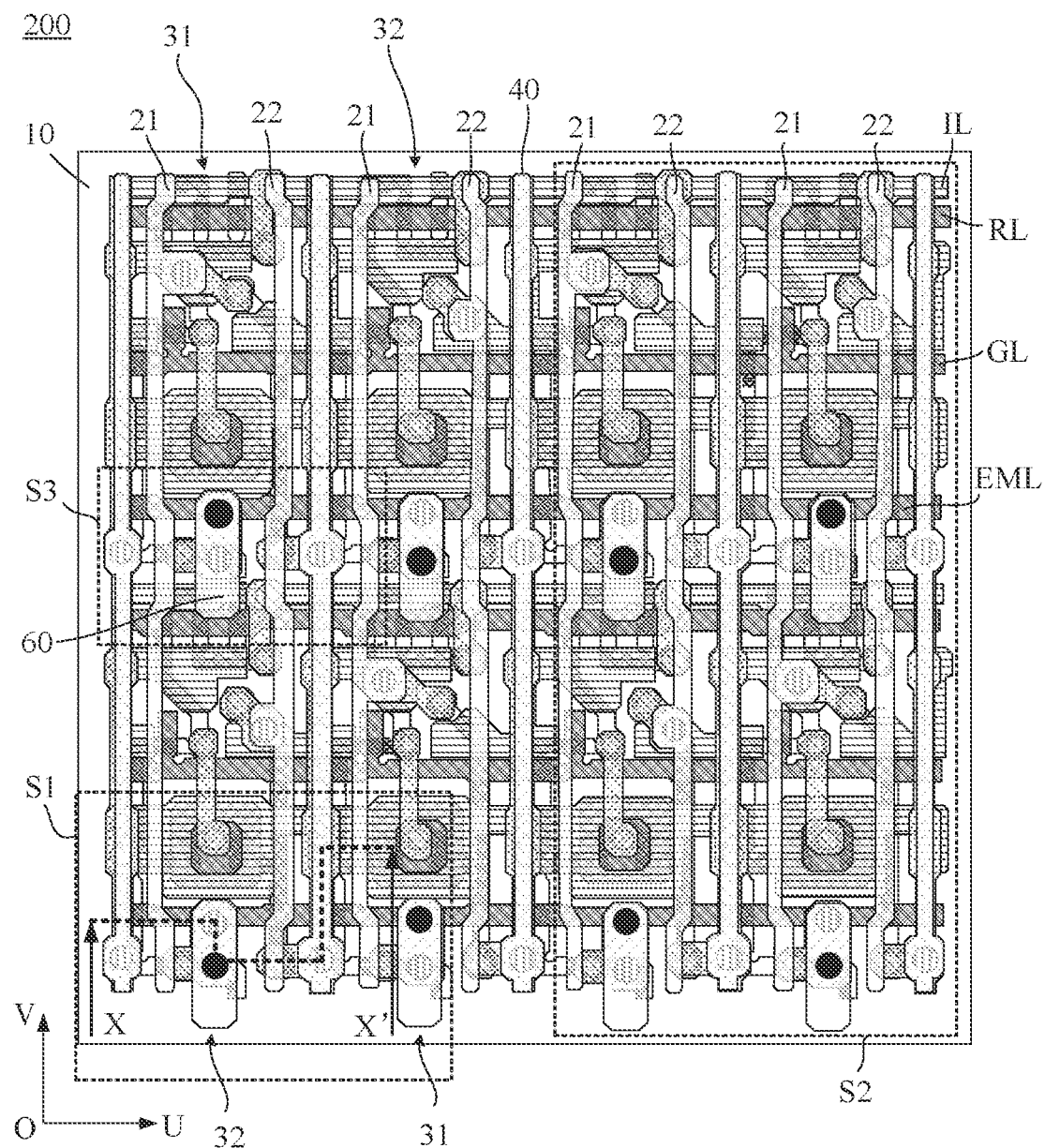
FIG. 7 is a schematic top view of a display substrate, in accordance with some embodiments.

Referring to FIGS. 7 to 14, some embodiments of the present disclosure provide a display substrate 200. As shown in FIGS. 7, 9A and 9B, the display substrate 200 includes a base 10, both a plurality of first data lines 21 and a plurality of second data lines 22 disposed on the base 10, and a plurality of sub-pixels disposed on the base 10 and arranged in an array. Every two adjacent columns of sub-pixels are provided with one first data line 21 and one second data line 22 therebetween.

Figure 10A:
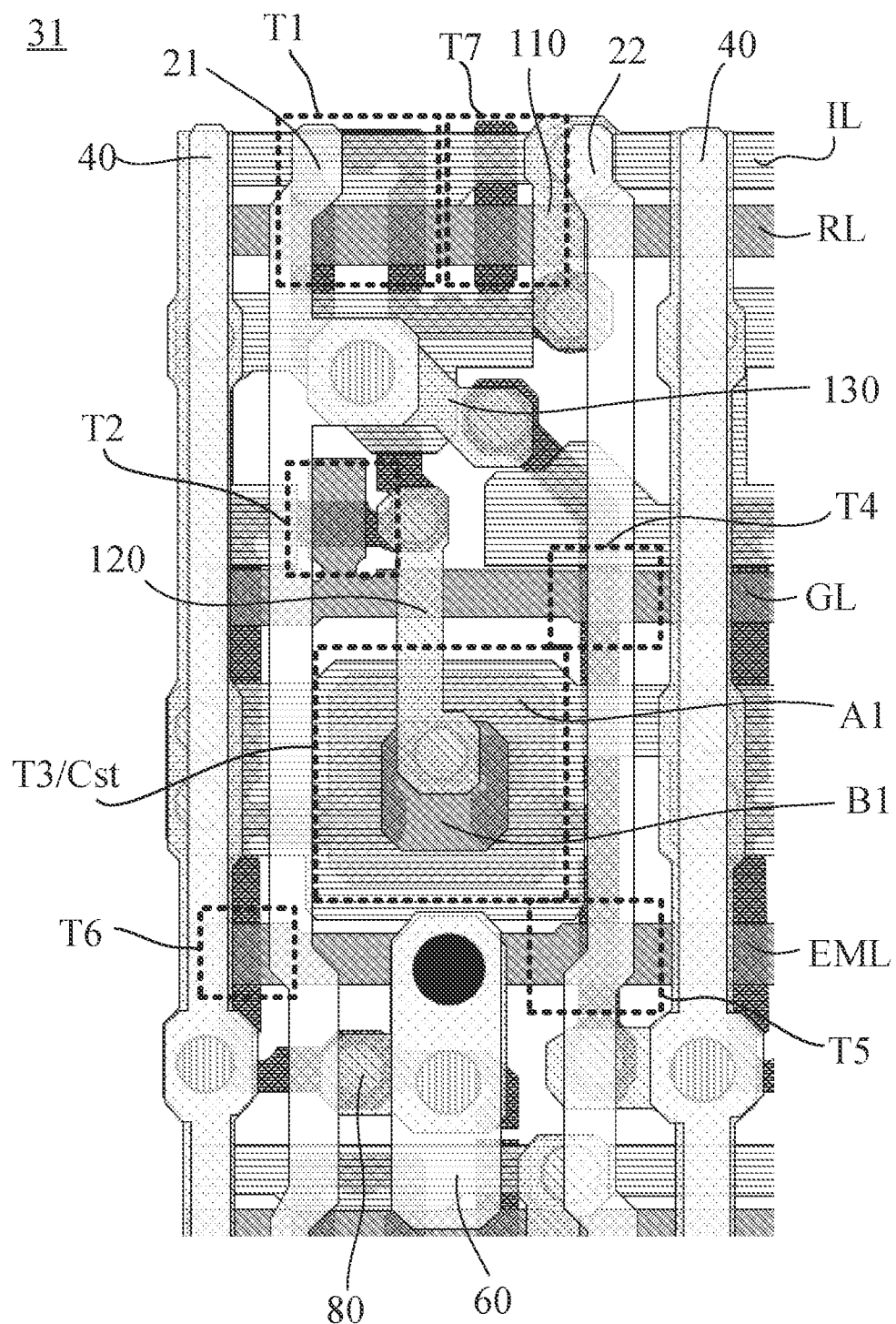
FIG. 10A is a schematic structural diagram of a sub-pixel, in accordance with some embodiments.
Figure 10B:
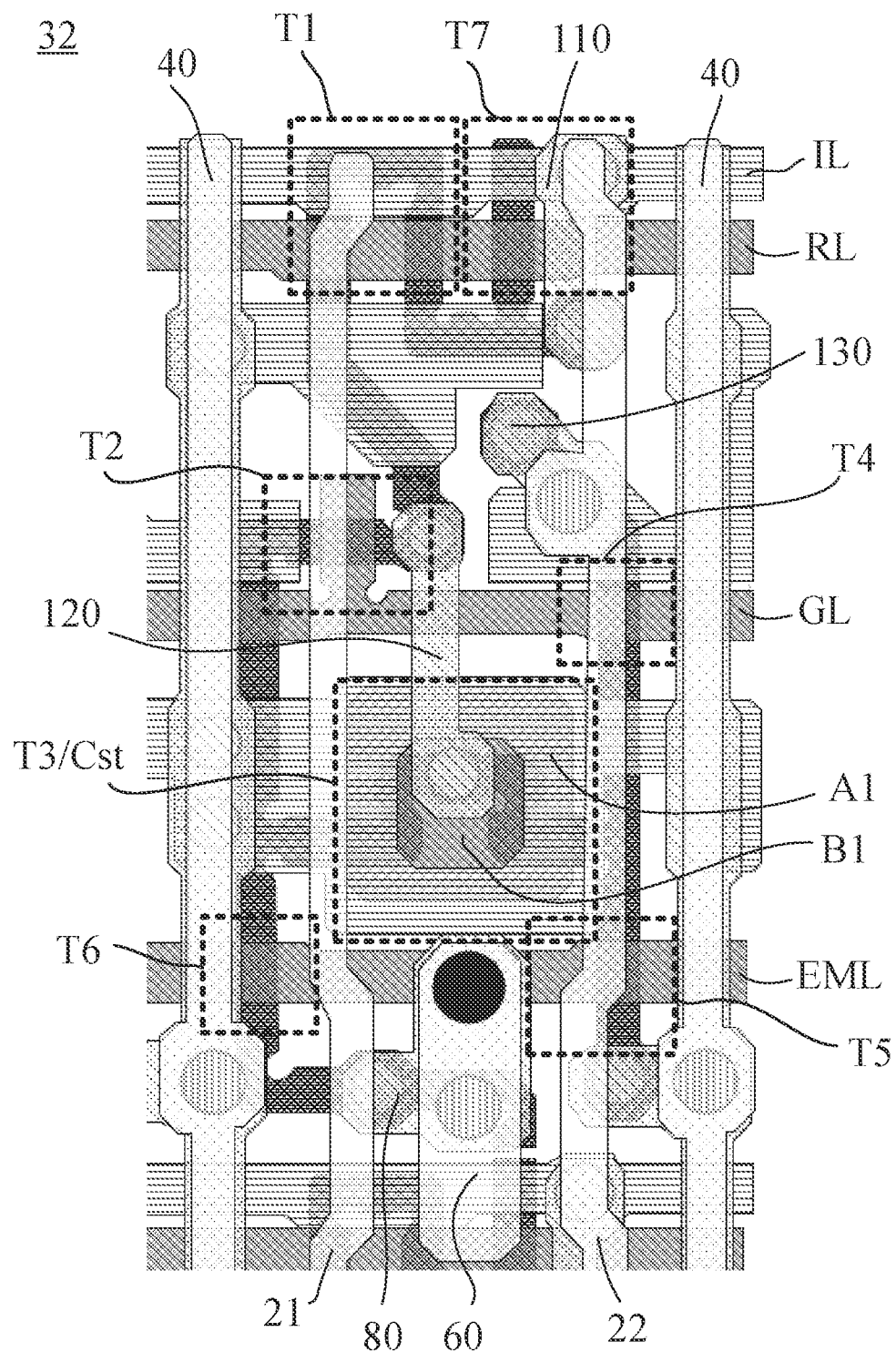
FIG. 10B is a schematic structural diagram of another sub-pixel, in accordance with some embodiments.

As shown in FIGS. 7, 10A and 10B, each column of sub-pixels includes a plurality of first sub-pixels 31 and a plurality of second sub-pixels 32. Here, for the convenience of description, a direction perpendicular to or substantially perpendicular to an extending direction of the column of sub-pixels is defined as a first direction OU. That is, the first direction OU is a row direction of the array arrangement of the plurality of sub-pixels. A direction parallel to or substantially parallel to the extending direction of the column of sub-pixels is defined as a second direction OV. That is, the second direction OV is a column direction of the array arrangement of the plurality of sub-pixels. The first sub-pixels 31 and the second sub-pixels 32 are alternately arranged in the second direction OV. In the first direction OU, the column of sub-pixels is adjacent to one first data line 21 and one second data line 22, and the first data line 21 and the second data line 22 are located at two sides of the column of sub-pixels. Each first sub-pixel 31 in the column of sub-pixels is electrically connected to the first data line 21 adjacent thereto, and each second sub-pixel 32 in the column of sub-pixels is electrically connected to the second data line 22 adjacent thereto.

The display substrate 200 further includes voltage signal lines 40 disposed on the base 10. An orthogonal projection of each voltage signal line 40 on the base 10 is located between orthogonal projections of the first data line 21 and the second data line 22 between two adjacent columns of sub-pixels, and each voltage signal line 40 is electrically connected to at least one column of sub-pixels. For example, the orthogonal projections of the first data line 21 and the second data line 22 between every two adjacent columns of sub-pixels on the base 10 have the orthogonal projection of the voltage signal line 40 on the base 10 therebetween.

It will be noted that a film layer such as an inorganic buffer layer 11 may further be disposed between the base 10 and the plurality of sub-pixels. The inorganic buffer layer 11 may be of a single-layer structure or a multi-layer laminated structure, e.g., a laminated structure in which inorganic film layers and organic film layers are alternately arranged.

Figure 11:
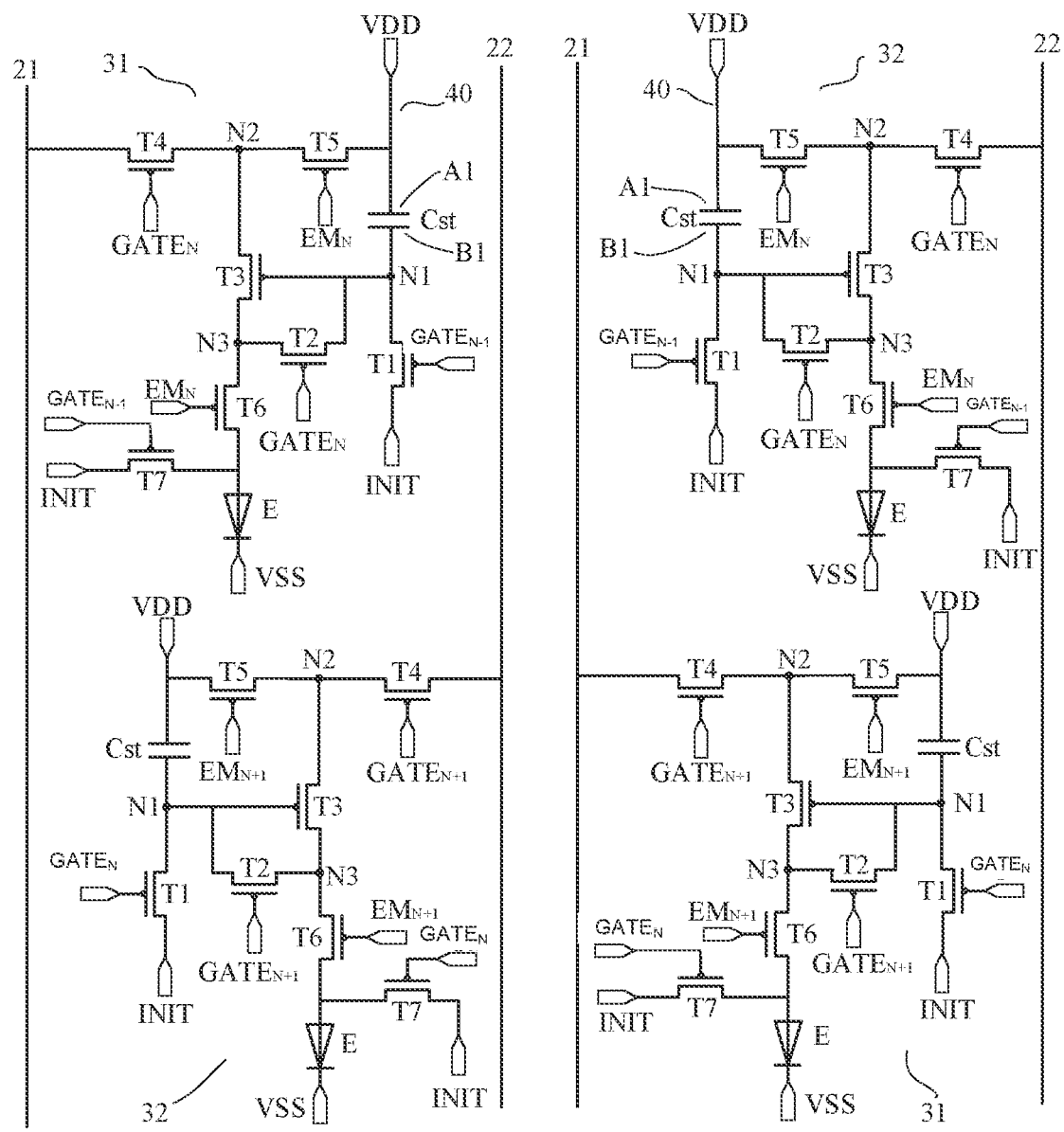
FIG. 11 is an equivalent circuit diagram of a portion of the display substrate shown in FIG. 7 in the S2 region.

FIG. 11 is an equivalent circuit diagram of a portion of the display substrate 200 shown in FIG. 7 in the S2 region. Here, the description is made in an example where the display substrate 200 includes two first sub-pixels 31 and two second sub-pixels 32 that are arranged in a matrix in the S2 region. Each first sub-pixel 31 and each second sub-pixel 32 have the pixel driving circuit of the 7T1C structure, and the pixel driving circuit includes the first transistor T1 to the seventh transistor T7 and the capacitor Cst.

Electrical connection relationships between the components inside the pixel driving circuit and the operating process of the pixel driving circuit may be referred to the above description, which will not be repeated here.

Structures of the components of the pixel driving circuit in the sub-pixel in the display substrate 200 will be exemplarily introduced below with reference to FIGS. 7 to 9B. The display substrate 200 includes an active layer $L_A$, a first gate metal layer $L_{G1}$, a second gate metal layer $L_{G2}$, and a first source-drain metal layer $L_{SD1}$ that are sequentially disposed on the base 10 in a thickness direction of the base 10. It will be noted that the $S_P$ region in FIG. 8D is a region corresponding to a sub-pixel. That is, structures in the $S_P$ region in FIG. 8D are a minimum repeating unit of the display substrate 200. As an example, the structures in the $S_P$ region corresponding to the sub-pixel will be introduced here and below.

Figure 8A:
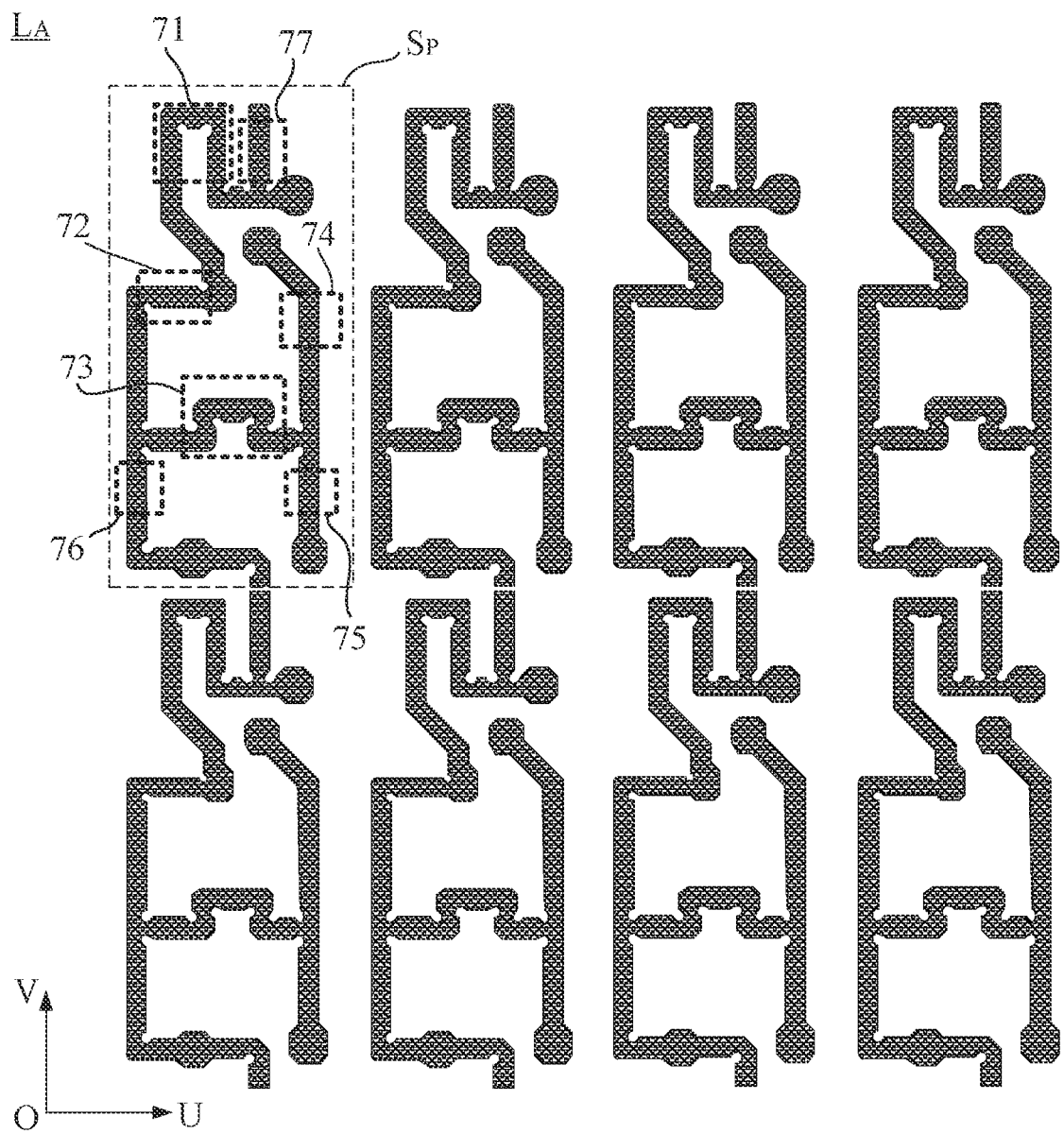
FIGS. 8A to 8H are schematic top views of film layers of the display substrate shown in FIG. 7.
Figure 9A:
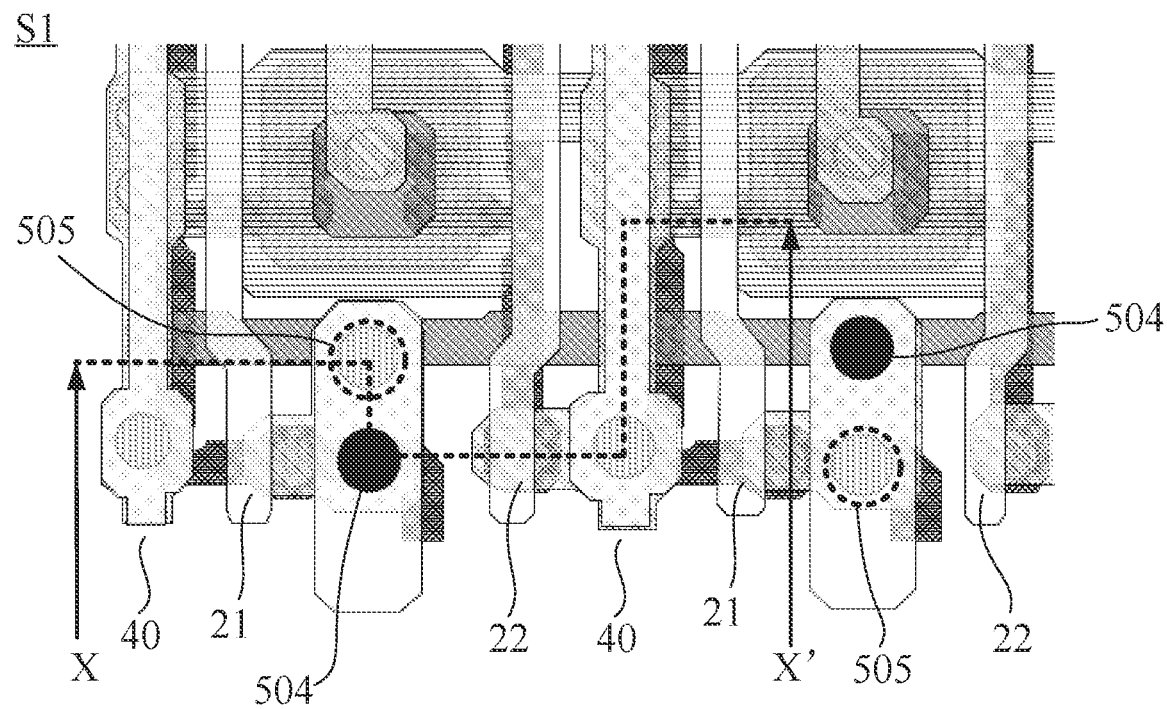
FIG. 9A is an enlarged partial diagram of the S1 region in FIG. 7.
Figure 9B:
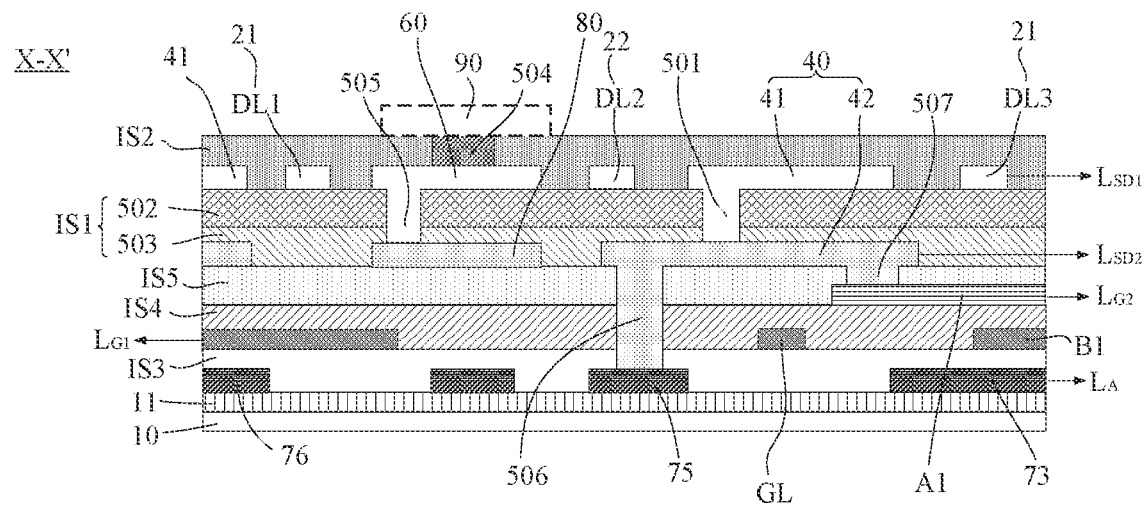
FIG. 9B is a schematic sectional view of the display substrate in FIG. 7 or FIG. 9A taken along the dashed line XX'.

As shown in FIGS. 8A and 9B, the active layer $L_A$ includes an active layer 71 of the first transistor T1, an active layer 72 of the second transistor T2, an active layer 73 of the third transistor T3, an active layer 74 of the fourth transistor T4, an active layer 75 of the fifth transistor T5, an active layer 76 of the sixth transistor T6 and an active layer 77 of the seventh transistor T7.

Figure 8B:
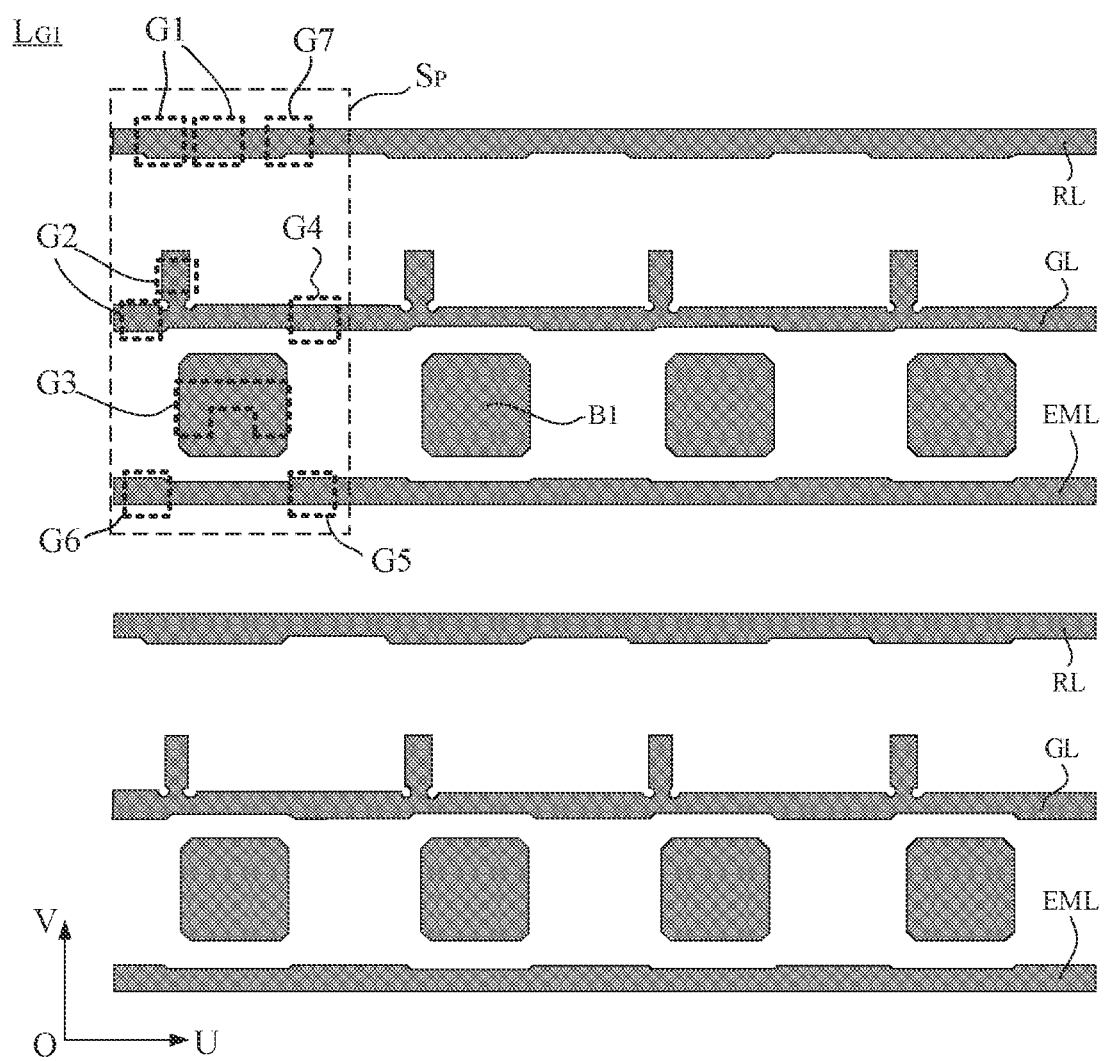

As shown in FIGS. 8B and 9B, the first gate metal layer $L_{G1}$ includes a gate G1 of the first transistor T1, a gate G2 of the second transistor T2, a gate G3 of the third transistor T3, a gate G4 of the fourth transistor T4, a gate G5 of the fifth transistor T5, a gate G6 of the sixth transistor T6 and a gate G7 of the seventh transistor T7. The first gate metal layer $L_{G1}$ further includes the second electrode plate B1 of the capacitor Cst, a reset signal line RL, a gate line GL and a light-emitting signal line EML. Here, the reset signal line RL is configured to transmit the reset signal Vre from the reset signal terminal RESET to a corresponding sub-pixel. The gate line GL is configured to transmit the scanning signal Vgate from the scan signal terminal GATE to a corresponding sub-pixel. The light-emitting signal line EML is configured to transmit the light-emitting signal Vem from the light-emitting signal terminal EM to a corresponding sub-pixel.

It will be noted that a portion of the first gate metal layer $L_{G1}$, whose orthogonal projection on the base 10 is overlapped with an orthogonal projection of the active layer 71 of the first transistor T1 on the base 10, may be used as the gate G1 of the first transistor T1. A portion of the first gate metal layer $L_{G1}$, whose orthogonal projection on the base 10 is overlapped with an orthogonal projection of the active layer 72 of the second transistor T2 on the base 10, may be used as the gate G2 of the second transistor T2. A portion of the first gate metal layer $L_{G1}$, whose orthogonal projection on the base 10 is overlapped with an orthogonal projection of the active layer 73 of the third transistor T3 on the base 10, may be used as the gate G3 of the third transistor T3. A portion of the first gate metal layer $L_{G1}$, whose orthogonal projection on the base 10 is overlapped with an orthogonal projection of the active layer 74 of the fourth transistor T4 on the base 10, may be used as the gate G4 of the fourth transistor T4. A portion of the first gate metal layer $L_{G1}$, whose orthogonal projection on the base 10 is overlapped with an orthogonal projection of the active layer 75 of the fifth transistor T5 on the base 10, may be used as the gate G5 of the fifth transistor T5. A portion of the first gate metal layer $L_{G1}$, whose orthogonal projection on the base 10 is overlapped with an orthogonal projection of the active layer 76 of the sixth transistor T6 on the base 10, may be used as the gate G6 of the sixth transistor T6. A portion of the first gate metal layer $L_{G1}$, whose orthogonal projection on the base 10 is overlapped with an orthogonal projection of the active layer 77 of the seventh transistor T7 on the base 10, may be used as the gate G7 of the seventh transistor T7.

Figure 8C:
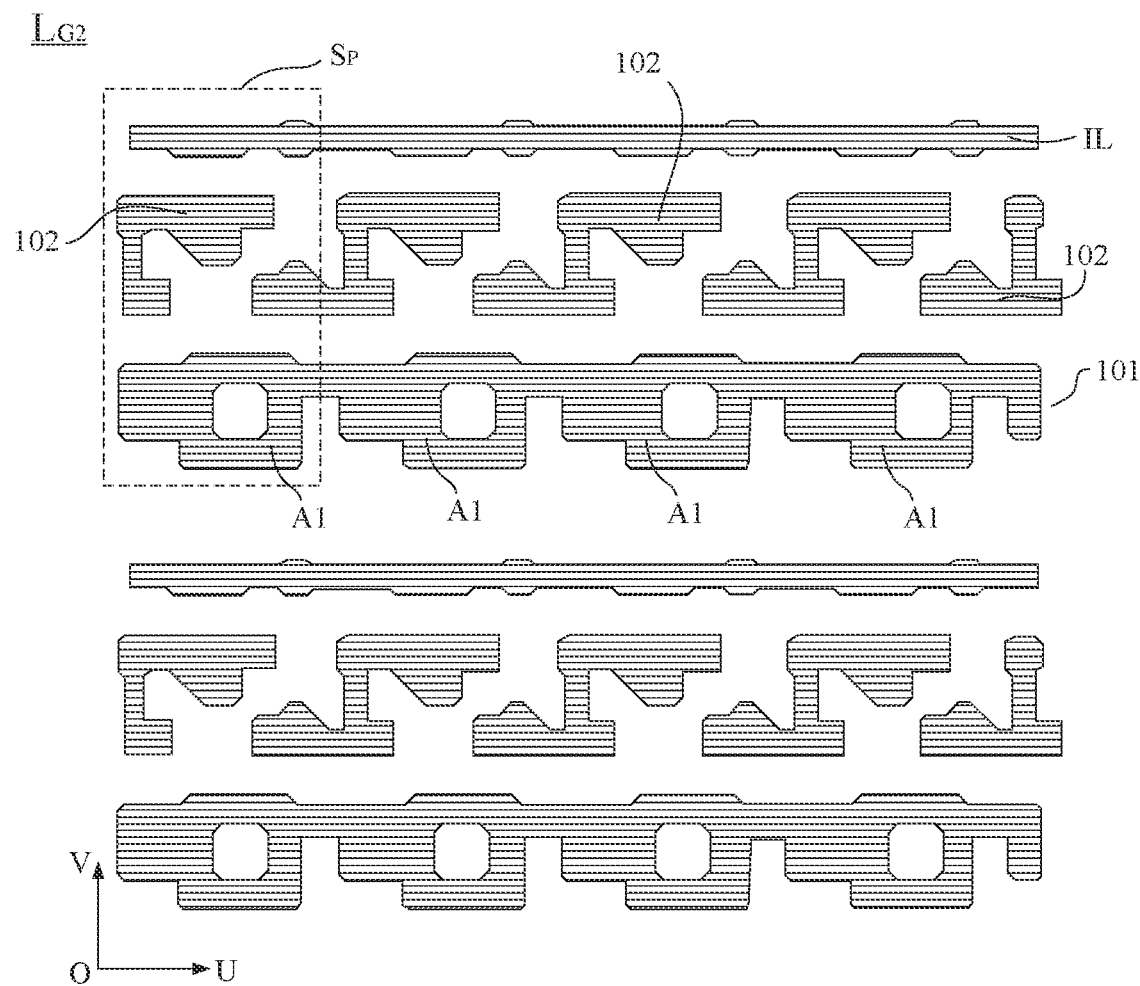
Figure 8D:
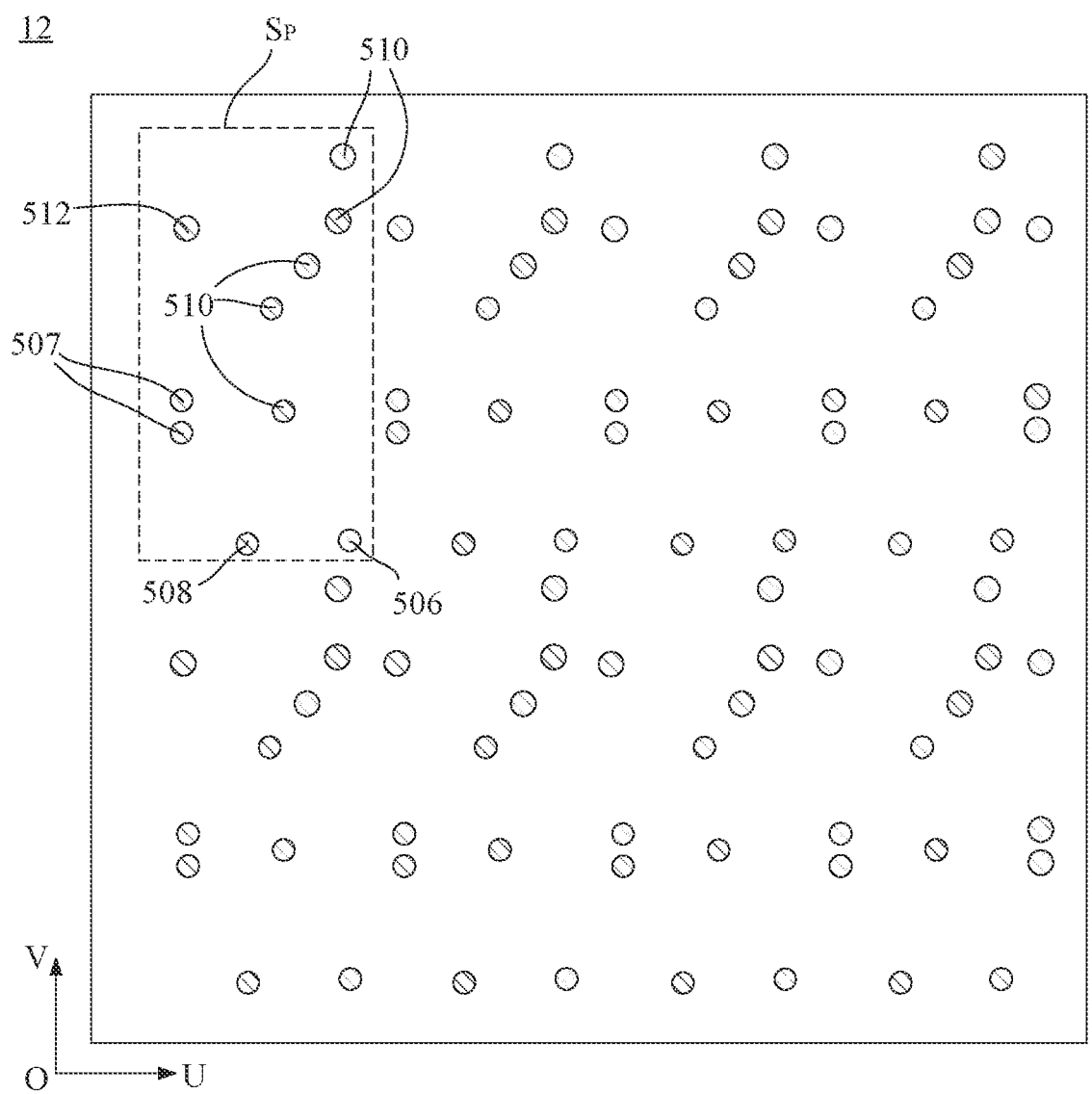

As shown in FIGS. 8C and 9B, the second gate metal layer $L_{G2}$ includes the first electrode plates A1 of the capacitors Cst, initialization voltage signal lines IL and shielding portions 102. The initialization voltage signal line is configured to transmit the initialization voltage signal Vin from the initialization voltage signal terminal INIT to a corresponding sub-pixel.

Figure 8E:
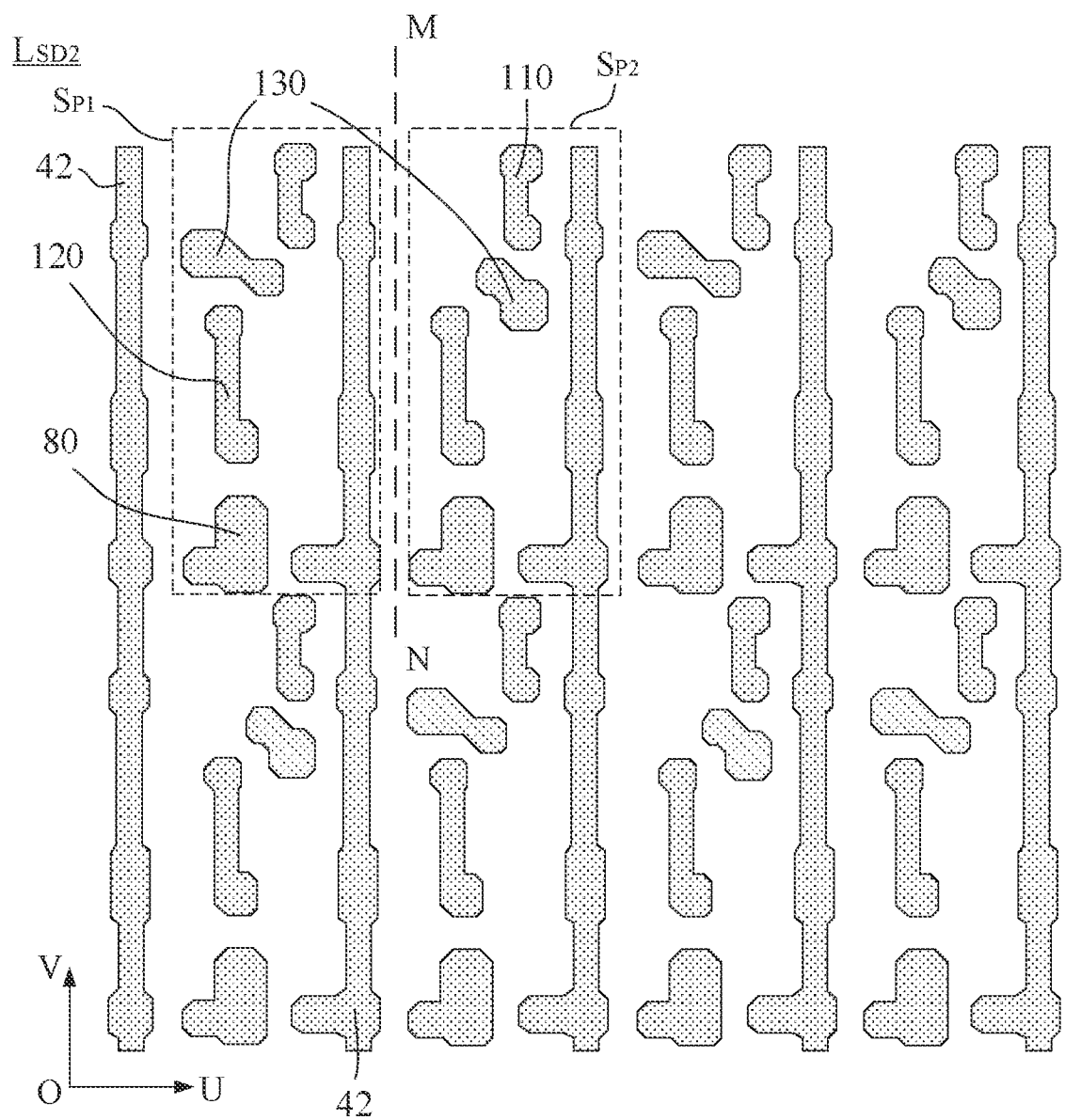
Figure 8F:
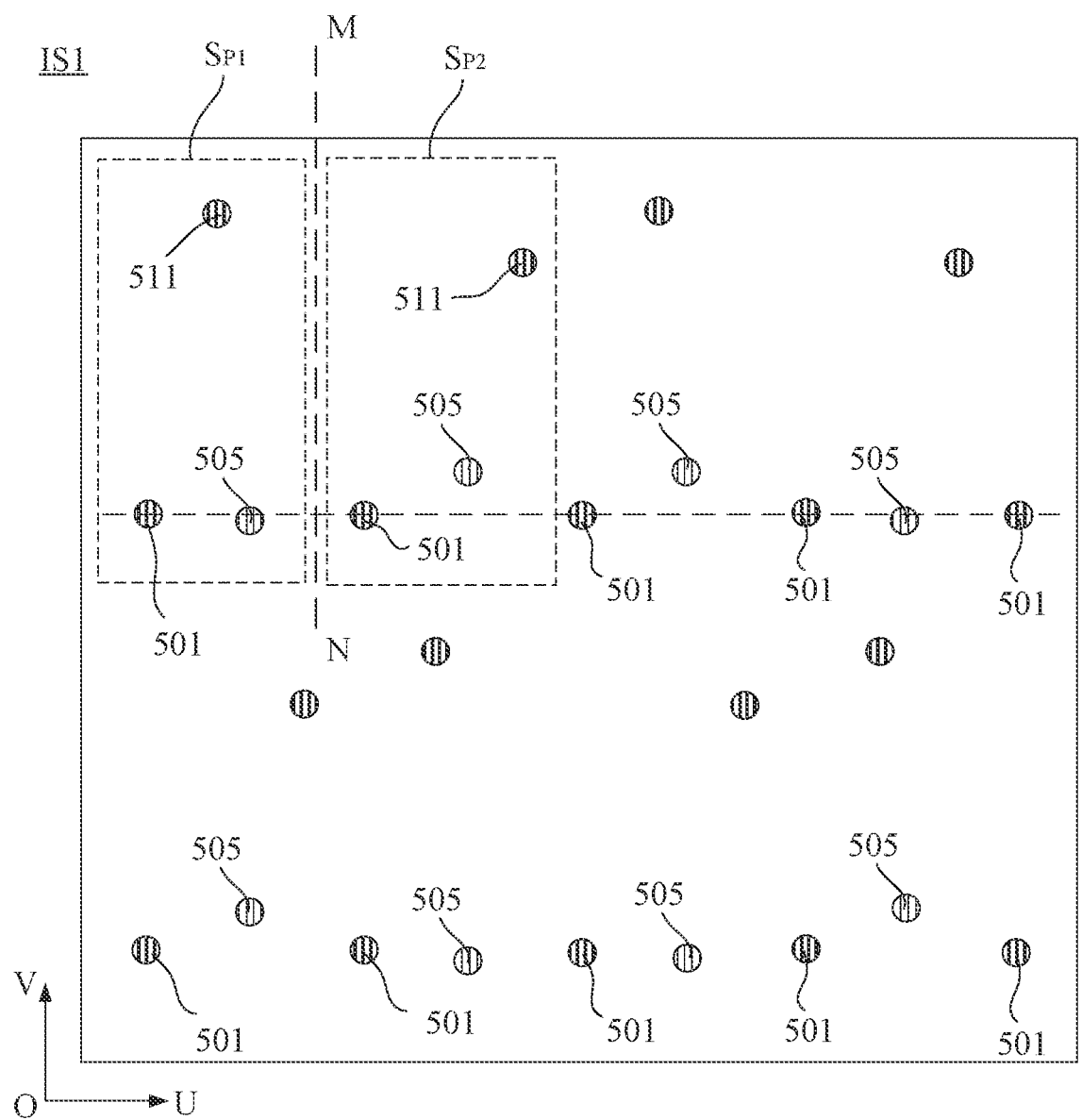
Figure 8G:
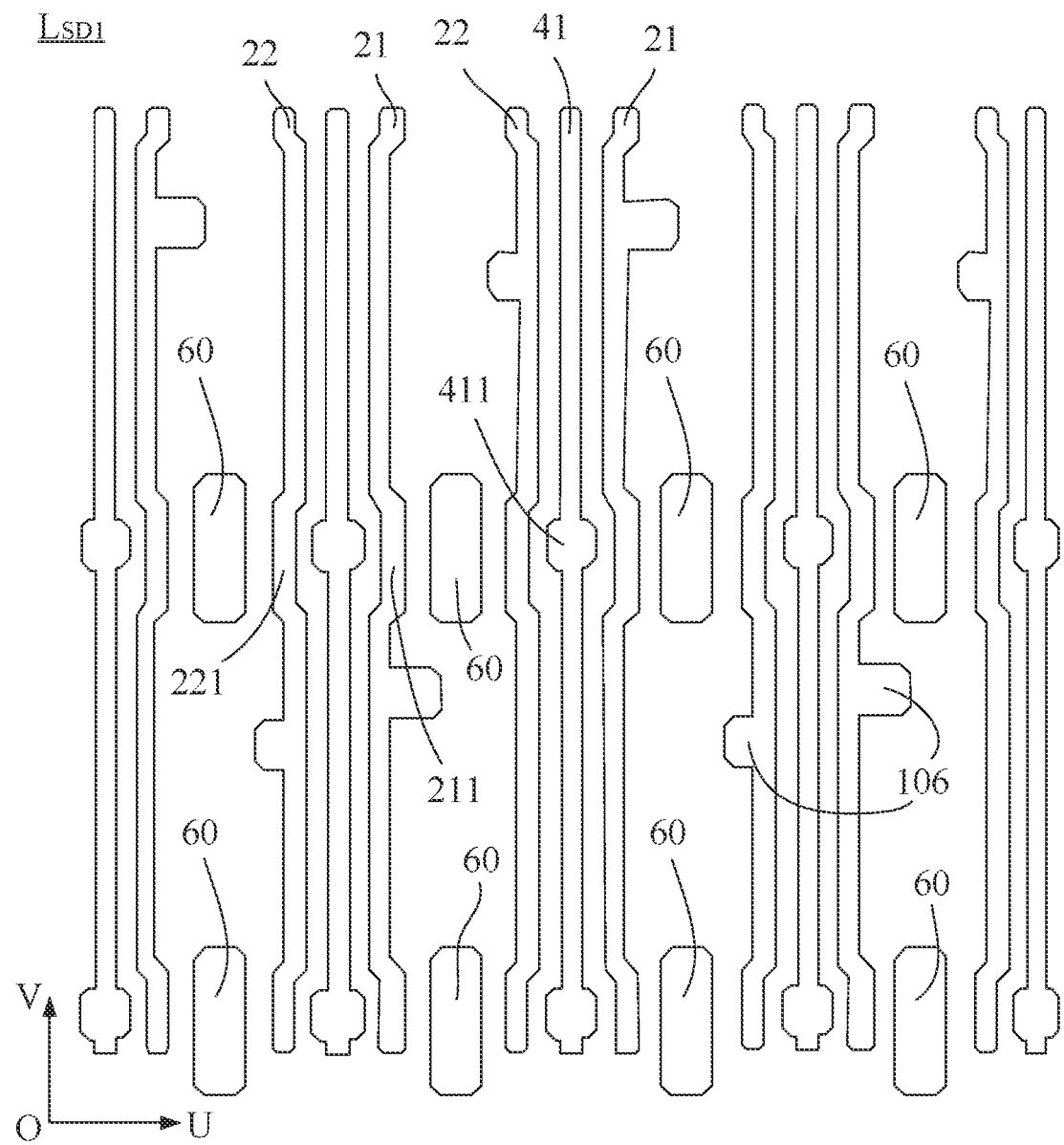

As shown in FIGS. 8G and 9B, the first source-drain metal layer $L_{SD1}$ includes the first data lines 21 and the second data lines 22, and the first data lines 21 and the second data lines 22 are alternately arranged in the first direction OU.

Hereinafter, connection relationships between the pixel driving circuits in the sub-pixels and the signal lines in the display substrate will be described with reference to FIG. 11.

In sub-pixels in a same column, the first electrodes of the fourth transistors T4 in the first sub-pixels 31 are electrically connected to a same first data line 21, and the first electrodes of the fourth transistors T4 in the second sub-pixels 32 are electrically connected to a same second data line 22. That is, the first sub-pixel 31 receives the data signal Vdata through the first data line 21, and the second sub-pixel 32 receives the data signal Vdata through the second data line 22.

The first electrodes of the fifth transistors T5 in the sub-pixels in the same column are electrically connected to the first voltage signal terminal VDD through a same voltage signal line 40. Here, the voltage signal line 40 may be used to transmit a first voltage signal Vdd from the first voltage signal terminal VDD to sub-pixels electrically connected thereto, and the first voltage signal Vdd is a constant voltage signal, such as a constant low voltage signal in FIG. 11.

The gates of the second transistors T2 and the fourth transistors T4 in sub-pixels in a same row are electrically connected to a same stage scan signal terminal GATE (e.g., an N-th stage scan signal terminal $GATE_N$ or an (N+1)-th stage scan signal terminal $GATE_{N+1}$) through a same gate line GL.

The gates of the fifth transistors T5 and the sixth transistors T6 in the sub-pixels in the same row are electrically connected to a same stage light-emitting signal terminal EM (e.g., an N-th stage light-emitting signal terminal $EM_N$ or an (N+1)-th stage light-emitting signal terminal $EM_{N+1}$) through a same light-emitting signal line EML.

The gates of the first transistors T1 and the seventh transistors T7 in the sub-pixels in the same row are electrically connected to the previous stage scan signal terminal GATE through a same reset signal line RL. It will be noted that the scanning signal Vgate output from the previous stage scan signal terminal GATE is used as the reset signal Vre. That is, the previous stage scan signal terminal GATE is used as the reset signal terminal RESET of the current sub-pixels. For example, in FIG. 11, the scanning signal Vgate output from the N-th stage scan signal terminal $GATE_N$ is used as the reset signal Vre of sub-pixels in which the second transistors T2 and the fourth transistors T4 are electrically connected to the (N+1)-th stage scan signal terminal $GATE_{N+1}$.

The first electrodes of the first transistors T1 and the seventh transistors T7 in the sub-pixels located in the same row are electrically connected to the initialization voltage signal terminal INIT through a same initialization voltage signal line IL. Here, the initialization voltage signal Vin output from the initialization voltage signal terminal INIT may be a constant voltage signal. For example, the initialization voltage signal Vin in FIG. 11 may be a constant low voltage signal.

In some embodiments, referring to FIGS. 8E and 9B, the display substrate 200 further includes a second source-drain metal layer $L_{SD2}$ disposed between the first source-drain metal layer $L_{SD1}$ and the second gate metal layer $L_{G2}$.

As shown in FIGS. 8E, 8G and 9B, each voltage signal line 40 includes a first voltage signal sub-line 41 and a second voltage signal sub-line 42, and the first voltage signal sub-line 41 is electrically connected to the second voltage signal sub-line 42. Here, the first voltage signal sub-line 41 is disposed in the first source-drain metal layer $L_{SD1}$ and the second voltage signal sub-line 42 is disposed in the second source-drain metal layer $L_{SD2}$. That is, the second voltage signal sub-line 42 is disposed on a side of the first voltage signal sub-line 41 proximate to the base 10. The first voltage signal sub-lines 41, the first data lines 21 and the second data lines 22 are arranged in a same layer.

The voltage signal line 40 may transmit the first voltage signal Vdd with a constant voltage signal to sub-pixels electrically connected thereto. That is, voltages of the first voltage signal sub-line 41 and the second voltage signal sub-line 42 may be stable voltages. When the display apparatus including the display substrate 200 displays a screen, the first voltage signal sub-line 41 disposed in a same layer as the first data line 21 and the second data line 22 and located therebetween has a stable voltage, and thus may shield the data signals Vdata transmitted through the first data line 21 and the second data line 22. In this way, in a display process of the display apparatus, the parasitic capacitance between the first data line 21 and the second data line 22 that are adjacent to each other may be reduced by the first voltage signal sub-line 41 disposed therebetween, thereby reducing the crosstalk between the data signals Vdata, and improving the display effect of the display apparatus.

It will be noted that the first voltage signal sub-lines 41, the first data lines 21 and the second data lines 22 may be formed through a same patterning process, so as to be arranged in the same layer.

In addition, the first sub-pixels 31 and the second sub-pixels may be alternately arranged in the first direction OU. For example, in the display substrate 200 shown in FIG. 7, the first sub-pixels 31 and the second sub-pixels 32 are alternately arranged in the first direction OU. In the first direction OU, the first sub-pixels 31 and the second sub-pixels 32 may also not be alternately arranged. For example, sub-pixels in a row are all composed of the first sub-pixels 31 or the second sub-pixels 32. For another example, the sub-pixels in the row include a plurality of first sub-pixels 31 and a plurality of second sub-pixels 32, and at least some of the first sub-pixels 31 and/or the second sub-pixels 32 are continuously arranged.

Figure 12:
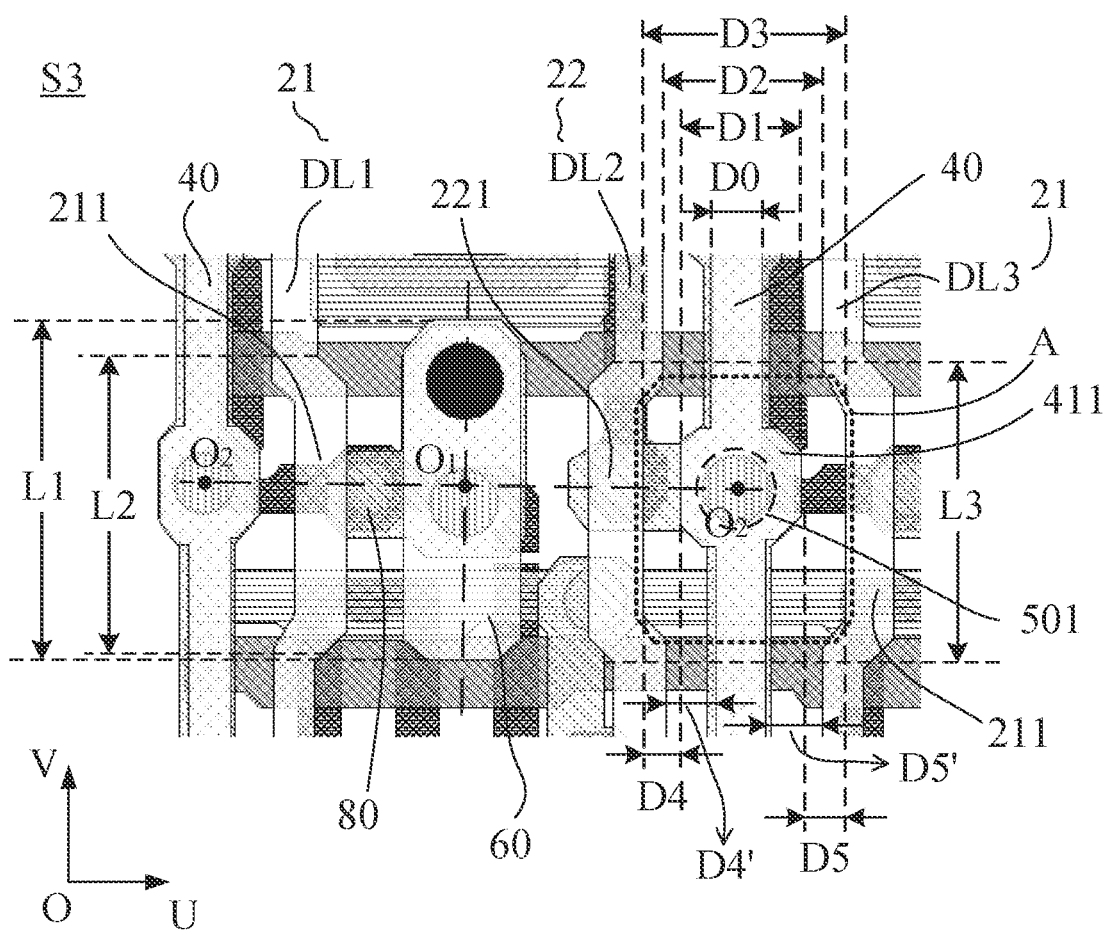
FIG. 12 is an enlarged partial diagram of the S3 region of the display substrate shown in FIG. 7.

For example, referring to FIGS. 8F, 9B and 12, the display substrate 200 further includes a first insulating layer IS1 disposed between the first voltage signal sub-lines 41 and the second voltage signal sub-lines 42, and the first insulating layer IS1 includes a plurality of first via holes 501. The first voltage signal sub-line 41 is electrically connected to the second voltage signal sub-line 42 through at least one of the plurality of first via holes 501.

For example, an orthogonal projection of the first voltage signal sub-line 41 on the base 10 is overlapped or partially overlapped with an orthogonal projection of the second voltage signal sub-line 42 on the base 10. In this way, an orthogonal projection of the first via hole 501 on the base 10 may be disposed in an overlapped or partially overlapped region of the orthogonal projections of the first voltage signal sub-line 41 and the second voltage signal sub-line 42, so as to connect the first voltage signal sub-line 41 and the second voltage signal sub-line 42 through the first via hole 501.

Here, the first insulating layer IS1 may be of a single-layer structure, or a laminated structure including a plurality of film layers. For example, as shown in FIG. 9B, the first insulating layer IS1 includes a first planarization layer 502 and a passivation layer 503 that are stacked. In this case, the first via hole 501 is a through hole that penetrates through the first planarization layer 502 and the passivation layer 503.

For example, referring to FIG. 8F, a line connecting two adjacent first via holes 501 may be parallel to or substantially parallel to the first direction OU.

In some embodiments, referring to FIGS. 7, 8G and 12, in the first data line 21 (referring to a data line DL3 in FIG. 12), the second data line 22 (referring to a data line DL2 in FIG. 12) and the first voltage signal sub-line 41 that are located between the two adjacent columns of sub-pixels, a portion of the first data line 21 adjacent to the first via hole 501 bends in a direction away from the first via hole 501 to form a first bent portion 211, and a portion of the second data line 22 adjacent to the first via hole 501 bends in a direction away from the first via hole 501 to form a second bent portion 221. The first bent portion 211 and the second bent portion 221 are opposite to each other to form an accommodating region A. The first voltage signal sub-line 41 includes a conductive portion 411 passing through the first via hole 501, and the conductive portion 411 is located in the accommodating region A.

It will be noted that the first voltage signal sub-line 41 is electrically connected to the second voltage signal sub-line 42 through the conductive portion 411 located at the first via hole 501. In this case, for example, referring to FIG. 12, in the first direction OU, a dimension D1 of the conductive portion 411 is greater than a width DO of a portion of the first voltage signal sub-line 41 other than the conductive portion 411. In this way, the first via hole 501 may have a large dimension in the first direction OU, thereby ensuring a good electrical contact between the first voltage signal sub-line 41 and the second voltage signal sub-line 42.

A dimension D3 of the accommodating region A in the first direction OU may be greater than a distance D2 between a portion of the first data line 21 (referring to the data line DL3) other than the first bent portion and a portion of the second data line 22 (referring to the data line DL2) other than the second bent portion between the two adjacent columns of sub-pixels. Here, the first bent portion 211 is beneficial for the first data line 21 to avoid the conductive portion 411 at the first via hole 501. Similarly, the second bent portion 221 is beneficial for the second data line 22 to avoid the conductive portion 411 at the first via hole 501. Therefore, the first data line 21 and the second data line 22 may be far away from the voltage signal line 40. That is, the first data line 21 and the second data line 22 may be prevented from being short-circuited with the voltage signal line 40, thereby improving a yield of the display substrate 200.

For example, referring to FIGS. 7 and 12, the first via hole 51 is disposed between two adjacent rows of sub-pixels, and is located between two adjacent columns of sub-pixels. In this case, both the first bent portion 211 and the second bent portion 221 may be prevented from occupying an arrangement space of the components in a sub-pixel adjacent thereto, so that bending degrees of the first bent portion 211 and the second bent portion 221 in the first direction OU may be set to be large, and the arrangement of the components in the adjacent sub-pixel may not be hindered. Therefore, the dimension D3 of the accommodating region A formed by the first bent portion 211 and the second bent portion 221 may be set to be large, so that the dimension D1 of the conductive portion 411 and the dimension of the first via hole 501 in the first direction OU may be also set to be large, which facilitates the electrical contact between the first voltage signal sub-line 41 and the second voltage signal sub-line. Based on this, for example, referring to FIG. 12, in the first data line 21, the second data line 22 and the first voltage signal sub-line 41 that are located between the two adjacent columns of sub-pixels, in the first direction OU, a distance D4 between the conductive portion 411 and the first bent portion 211 is equal to or substantially equal to a distance D5 between the conductive portion 411 and the second bent portion 221.

For example, referring to FIG. 12, in the first data line 21, the second data line 22 and the first voltage signal sub-line 41 that are located between the two adjacent columns of sub-pixels, in the first direction OU, the distance D4 between the conductive portion 411 and the first bent portion 211 is equal to or substantially equal to a distance D4' between the portion of the first data line 21 other than the first bent portion and the portion of the first voltage signal sub-line 41 other than the conductive portion.

For example, referring to FIG. 12, in the first data line 21, the second data line 22 and the first voltage signal sub-line 41 that are located between the two adjacent columns of sub-pixels, in the first direction OU, a distance D5 between the conductive portion 411 and the second bent portion 221 is equal to or substantially equal to a distance D5' between the portion of the second data line 22 other than the second bent portion and the portion of the first voltage signal sub-line 41 other than the conductive portion.

In some embodiments, referring to FIGS. 7, 8G, 9B and 12, in the first data line 21 (referring to the data line DL1 in FIG. 12) and the second data line 22 (referring to the data line DL2 in FIG. 12) that are adjacent to a column of sub-pixels and located on two sides of the column of sub-pixels (i.e., the left and right sides of the column of sub-pixels in FIG. 12) in the first direction OU, the first bent portion 211 bends toward the second data line 22, and the second bent portion 221 bends toward the first data line 21, i.e., bending directions of the first bent portion 211 and the second bent portion 221 are opposite to each other. In this case, for example, referring to FIGS. 8G and 9B, the display substrate 200 further includes first connection portions 60 disposed in the first source-drain metal layer $L_{SD1}$. That is, the first voltage signal sub-lines 41 and the first connection portions 60 are disposed in a same layer. The first connection portion 60 is disposed between the first bent portion 211 and the second bent portion 221. Here, the first connection portion 60 may be configured to shield the data signals Vdata of the first data line 21 and the second data line 22.

It will be noted that in the first data line 21 (referring to the data line DL3) and the second data line 22 (referring to the data line DL2) that are located between two adjacent columns of sub-pixels, bending directions of the first bent portion 211 and the second bent portion 221 are opposite to each other. That is, the first bent portion 221 bends in a direction away from the second bent portion 221, and the second bent portion 221 bends in a direction away from the first bent portion 211, so as to avoid the first via hole 501 therebetween. Therefore, in the first data line 21 (referring to the data line DL1) and the second data line 22 (referring to the data line DL2) that are electrically connected to a same column of sub-pixels, the first bent portion 211 and the second bent portion 221 are arranged opposite to each other. That is, the first bent portion 211 bends toward the second bent portion 221, and the second bent portion 221 bends toward the first bent portion 211.

In a case where the first connection portion 16 is provided, the first connection portion 60 may shield the data signals Vdata of the first data line 21 and the second data line 22, so that the crosstalk between the data signals Vdata may be reduced, thereby improving the display effect of the display apparatus.

For example, referring to FIG. 12, in the second direction OV, a dimension L1 of the first connection portion 60 is greater than or equal to both a length L2 of the first bent portion 211 and a length L3 of the second bent portion 221, and thus a facing area of the first bent portion 211 and the second bent portion 221 may be reduced. That is, the parasitic capacitance may be further reduced, which is beneficial for the first connection portion 60 to further reduce the crosstalk between the data signals Vdata.

In some embodiments, referring to FIG. 12, in the case where the display substrate 200 further includes the first connection portions 60, in the second direction OV, maximum dimensions of two portions of the first connection portion 60 located on two sides of a line connecting centers of two first via holes 501 adjacent thereto are substantially equal.

It will be noted that an orthogonal projection of the first connection portion 60 on the base 10 may be a regular pattern or an irregular pattern. For example, referring to FIGS. 7 and 12, in a case where the orthogonal projection of the first connection portion 60 on the base 10 is a regular pattern, an orthogonal projection of a geometric center $O_1$ of the first connection portion 60 on the base 10, and orthogonal projections of the centers $O_2$, on the base 10, of the two first via holes 501 adjacent to the first connection portion 60 are substantially located on a same straight line. Here, in the case where the orthogonal projection of the first connection portion 60 on the base 10 is the regular pattern, i.e., in a case where the orthogonal projection of the first connection portion 60 has a geometric center, the geometric center of the orthogonal projection of the first connection portion 60 and geometric centers of orthogonal projections of the two first via holes 501 adjacent thereto are substantially located on a same straight line. In this way, the facing area of the first bent portion 211 and the second bent portion 221 is reduced to 0, thereby further improving the shielding effect of the first connection portion 60 on the data signals Vdata of the first data line 21 and the second data line 22, and reducing the crosstalk between the data signals Vdata.

In some embodiments, referring to FIGS. 8A, 9B, 10A, 10B and 11, the display substrate 200 further includes an anode layer 90 disposed in the light-emitting device E in each sub-pixel and the sixth transistor T6 disposed in the pixel driving circuit in each sub-pixel. The active layer 76 of the sixth transistor T6 includes a first conductor portion, and the first connection portion 60 is electrically connected to the first conductor portion of the active layer 76 and the anode layer 90. That is, the first conductor portion of the active layer 76 is electrically connected to the anode layer 90 through the first connection portion 60.

Here, the active layer 76 of the sixth transistor T6 may include the first conductor portion, a channel portion, and a second conductor portion. The first conductor portion and the second conductor portion are connected through the channel portion. The first conductor portion may be used as one of a source and a drain of the sixth transistor T6, and the second conductor portion may be used as another one of the source and the drain of the sixth transistor T6. For example, referring to FIG. 11, in the case where the sixth transistor T6 is a P-type transistor, the first conductor portion connected to the anode layer 90 is used as the drain of the sixth transistor T6, and the second conductor portion is used as the source of the sixth transistor T6.

In addition, referring to FIG. 11 and the above description, the sixth transistor T6 and the fifth transistor T5 are configured to form the path between the first voltage signal terminal VDD and the second voltage signal terminal VSS in response to the light-emitting signal Vem from the light-emitting signal terminal EM. Here, the sixth transistor T6 may be referred to as a first light-emitting control transistor, and the fifth transistor T5 is referred to as a second light-emitting control transistor.

In this way, the first connection portion 60 is electrically connected to the light-emitting device E, and the light-emitting device E is electrically connected to the second voltage signal terminal VSS, so that in a process of displaying an image by the display apparatus including the display substrate 200, the first connection portion 60 may shield the data signals Vdata of the first data line 21 and the second data line 22 that are located between the two adjacent columns of sub-pixels due to its stable voltage, thereby reducing the crosstalk between the data signals Vdata, and improving the display effect of the display apparatus.

It will also be noted that since the first connection portions 60 in the display substrate 200 are arranged in a same layer as the first voltage signal sub-lines 41, the first data lines 21 and the second data lines 22, the first connection portion 60 for reducing the crosstalk between the data signals Vdata of the first data line 21 and the second data line 22 may be formed without adding an additional patterning process.

Figure 13:
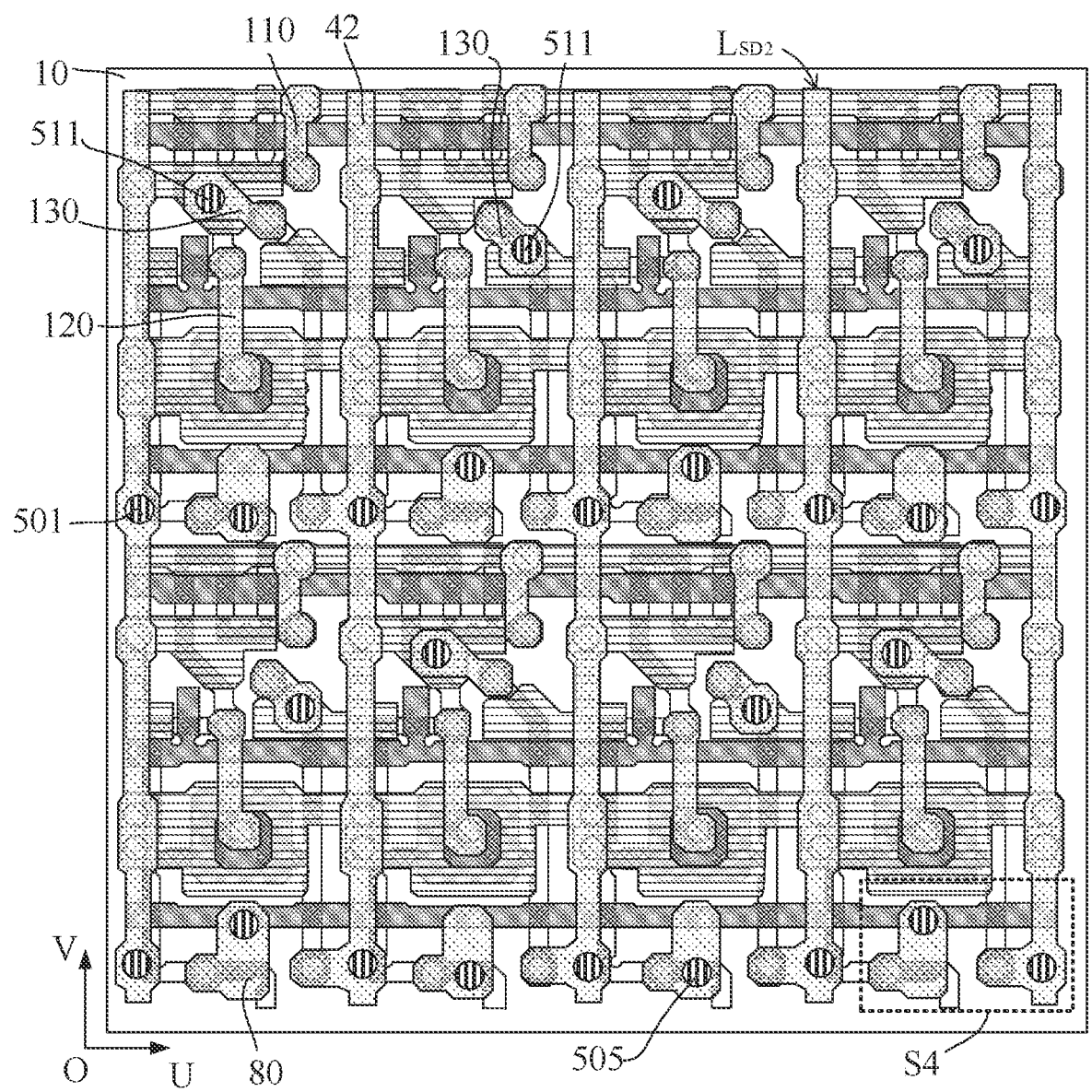
FIG. 13 is a schematic diagram of another display substrate, in accordance with some embodiments.

It will be noted that since the display substrate 200 includes many film layers, the light-emitting devices E in sub-pixels are not shown in FIG. 13. For example, the light-emitting device E is disposed on a side of the first connection portion 60 away from the base 10, and the light-emitting device E includes the anode layer 90, a light-emitting functional layer and a cathode layer that are arranged in a direction away from the base 10. At least one portion of the anode layer 90 electrically connected to the first connection portion 60 is shown in dashed outline in FIG. 9B.

For example, referring to FIGS. 8D and 9B, the display substrate 200 further includes a third insulating layer IS3, a fourth insulating layer IS4 and a fifth insulating layer IS5 that are disposed between the active layer $L_A$ and the second source-drain metal layer $L_{SD2}$. The third insulating layer IS3, the fourth insulating layer IS4 and the fifth insulating layer IS5 are sequentially arranged in the direction away from the base 10. It will be noted that FIG. 8D shows a top view of a laminated structure 12 composed of the third insulating layer IS3, the fourth insulating layer IS4 and the fifth insulating layer IS5. Here, the laminated structure 12 is shown in a transparent form for clarity in illustrating locations of via holes disposed in the laminated structure 12.

Based on this, in some embodiments, the display substrate 200 further includes second connection portions 80. Each second connection portion 80 is disposed between the active layer 76 of the sixth transistor T6 and a corresponding first connection portion 60, and the second connection portions 80 and the second voltage signal sub-lines 42 are arranged in a same layer.

The second connection portion 80 is electrically connected to the active layer 76 of the sixth transistor T6 and the corresponding first connection portion 60. That is, the first connection portion 60 is electrically connected to the active layer 76 of the sixth transistor T6 through the second connection portion 80. The second connection portion 80 facilitates the electrical connection between the first connection portion 60 and the active layer 76 of the sixth transistor T6.

Figure 14:
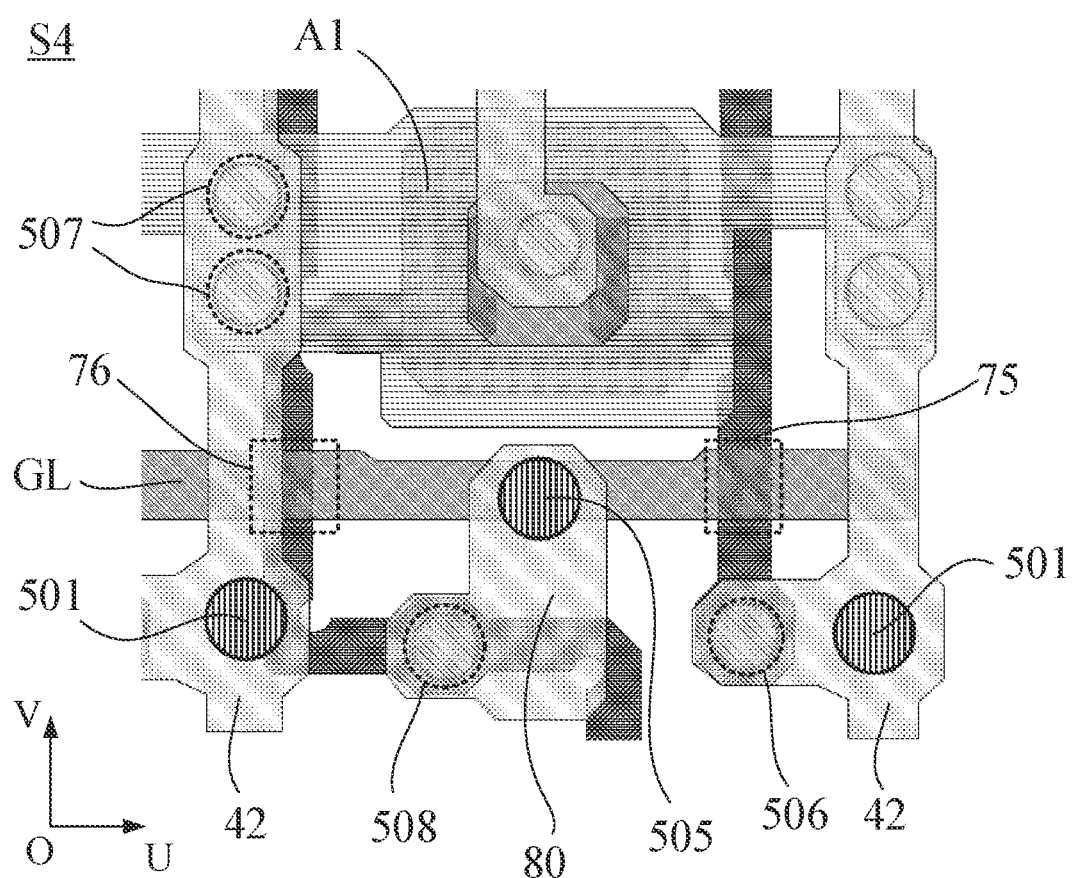
FIG. 14 is an enlarged partial diagram of the S4 region of the display substrate shown in FIG. 13.

For example, referring to FIGS. 8D and 14, the laminated structure 12 is further provided with sixth via holes 508 that penetrate therethrough. The second connection portion 80 is electrically connected to the active layer 76 of the sixth transistor T6 through the sixth via hole 508.

The light-emitting functional layer includes a light-emitting material layer. In addition, the light-emitting functional layer may further include at least one of an election transporting layer (ETL), an electron injection layer (EIL), a hole transporting layer (HTL), or a hole injection layer (HIL). The light-emitting material layer may be an organic light-emitting material layer. In this case, the display apparatus including the display substrate 200 is an organic light-emitting diode (OLED) display apparatus. The light-emitting material layer may also be a quantum dot light-emitting material layer. In this case, the display apparatus including the display substrate 200 is a quantum dot light-emitting diode (QLED) display apparatus.

Figure 8H:
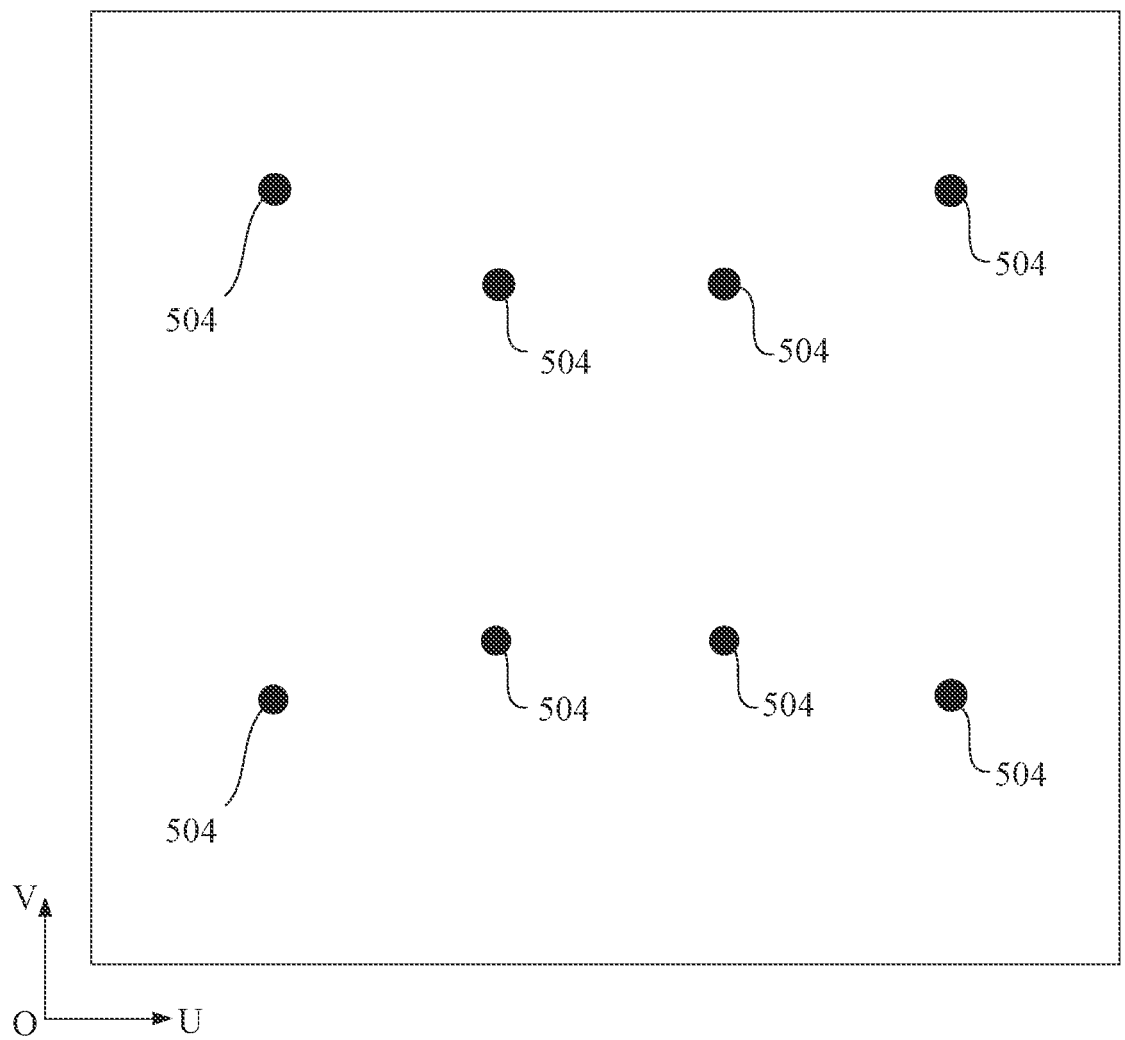

For example, referring to FIGS. 8H, 9A and 9B, the display substrate 200 further includes a second insulating layer IS2 disposed between the anode layers 90 and the first connection portions 60. The second insulating layer IS2 may be, for example, a second planarization layer. The second insulating layer IS2 is provided with second via holes 504. An orthogonal projection of the second via hole 504 on the base 10 is located within the orthogonal projection of the first connection portion 60 on the base 10. The anode layer 90 of the light-emitting device E is electrically connected to the first connection portion 60 through the second via hole 504.

In some embodiments, referring to FIG. 12, the orthogonal projection of the first connection portion 60 on the base 10 and an orthogonal projection of the second connection portion 80 on the base 10 have an overlapped region. Thus, a via hole, whose orthogonal projection on the base 10 is located within the overlapped region, may be provided to connect the first connection portion 60 and the second connection portion 80 through the via hole.

For example, referring to FIGS. 8F, 9A, 9B and 14, third via holes 505 are further provided in the first insulating layer IS1, and an orthogonal projection of each third via hole 505 on the base 10 is located within the overlapped region of the orthogonal projections of the first connection portion 60 and the second connection portion 80 on the base 10. The first connection portion 60 is electrically connected to the second connection portion 80 through the third via hole 505.

In some embodiments, referring to FIGS. 10A to 11, in a case where the first sub-pixel 31 and the second sub-pixel 32 both include the fifth transistor T5 (also referred to as the second light-emitting control transistor) and the capacitor Cst, as shown in FIG. 9B, the second voltage signal sub-line 42 is electrically connected to the active layer 75 of the fifth transistor T5.

For example, as shown in FIGS. 8D, 9B and 14, the third insulating layer IS3, the fourth insulating layer IS4 and the fifth insulating layer IS5 are provided with fourth via holes 506 that penetrate therethrough. The active layer 75 of the fifth transistor T5 is electrically connected to the second voltage signal sub-line 42 through the fourth via hole 506.

Based on this, in some embodiments, as shown in FIGS. 8D, 9B and 14, the first electrode plate A1 of the capacitor Cst is provided between the fourth insulating layer IS4 and the fifth insulating layer IS5, and the second electrode plate B1 is provided between the third insulating layer IS3 and the fourth insulating layer IS4. That is, the first electrode plate A1 is located on a side of the second voltage signal sub-line 42 proximate to the base 10, and the second electrode plate B1 is located on a side of the first electrode plate A1 proximate to the base 10. The first electrode A1 and the second electrode plate B1 are arranged opposite to each other. That is, plate surfaces of the first electrode plate A1 and the second electrode plate B1 are at least partially opposite to each other. The second voltage signal sub-line 42 is further electrically connected to the first electrode plate A1 of the capacitor Cst. For example, referring to FIG. 9B, a plurality of fifth via holes 507 are provided in the fifth insulating layer IS5. The second voltage signal sub-line 42 is electrically connected to the first electrode plate A1 of the capacitor Cst through the fifth via hole 507. Here, the second voltage signal sub-line 42 is electrically connected to the first electrode plate A1 of the capacitor Cst through one fifth via hole 507. Or, as shown in FIG. 14, the second voltage signal sub-line 42 is electrically connected to the first electrode plate A1 of the capacitor Cst through two or more fifth via holes 507, so as to ensure a good electrical contact between the second voltage signal sub-line 42 and the first electrode plate A1.

In some embodiments, referring to FIGS. 7 and 8C, in the sub-pixels in the same row, the first electrode plates A1 of the capacitors Cst in at least two adjacent sub-pixels are electrically connected to each other. Here, at least some of the first voltage signal sub-lines 41 may be connected in parallel through these first electrode plates A1 of the capacitors Cst that are electrically connected to each other. That is, at least some of the voltage signal lines 40 are connected in parallel, so that a resistance of the voltage signal lines 40 connected in parallel may be reduced, and thus a divided voltage of the voltage signal lines 40 may be reduced.

Based on this, for example, as shown in FIGS. 7 and 8C, in the sub-pixels in each row, the first electrode plates A1 of the capacitors Cs in a plurality of sub-pixels such as all sub-pixels are electrically connected to each other, so as to form a plurality of auxiliary conductive strips 101 extending in the first direction OU. Orthogonal projections of the plurality of auxiliary conductive strips 101 on the base 10 and orthogonal projections of the plurality of first voltage signal sub-lines 41 on the base 40 intersect to form a grid structure. Thus, the voltage signal lines 40 are connected in parallel, so that the resistance of the voltage signal lines 40 is further reduced, and the divided voltage thereof is further reduced.

Other connection relations in the pixel driving circuit in the display substrate 200 that are not introduced will be exemplarily introduced below.

Referring to FIG. 8E, the second source-drain metal layer $L_{SD2}$ further includes third connection portions 110, fourth connection portions 120 and fifth connection portions 130. Referring to FIGS. 8D and 15D, the laminated structure 12 further includes a plurality of seventh via holes 510 that penetrate therethrough. The fourth insulating layer IS4 further includes a plurality of tenth via holes 513 that penetrate therethrough. The fourth insulating layer IS4 and the fifth insulating layer IS5 include a plurality of eleventh via holes 514 that penetrate therethrough.

Figure 15A:
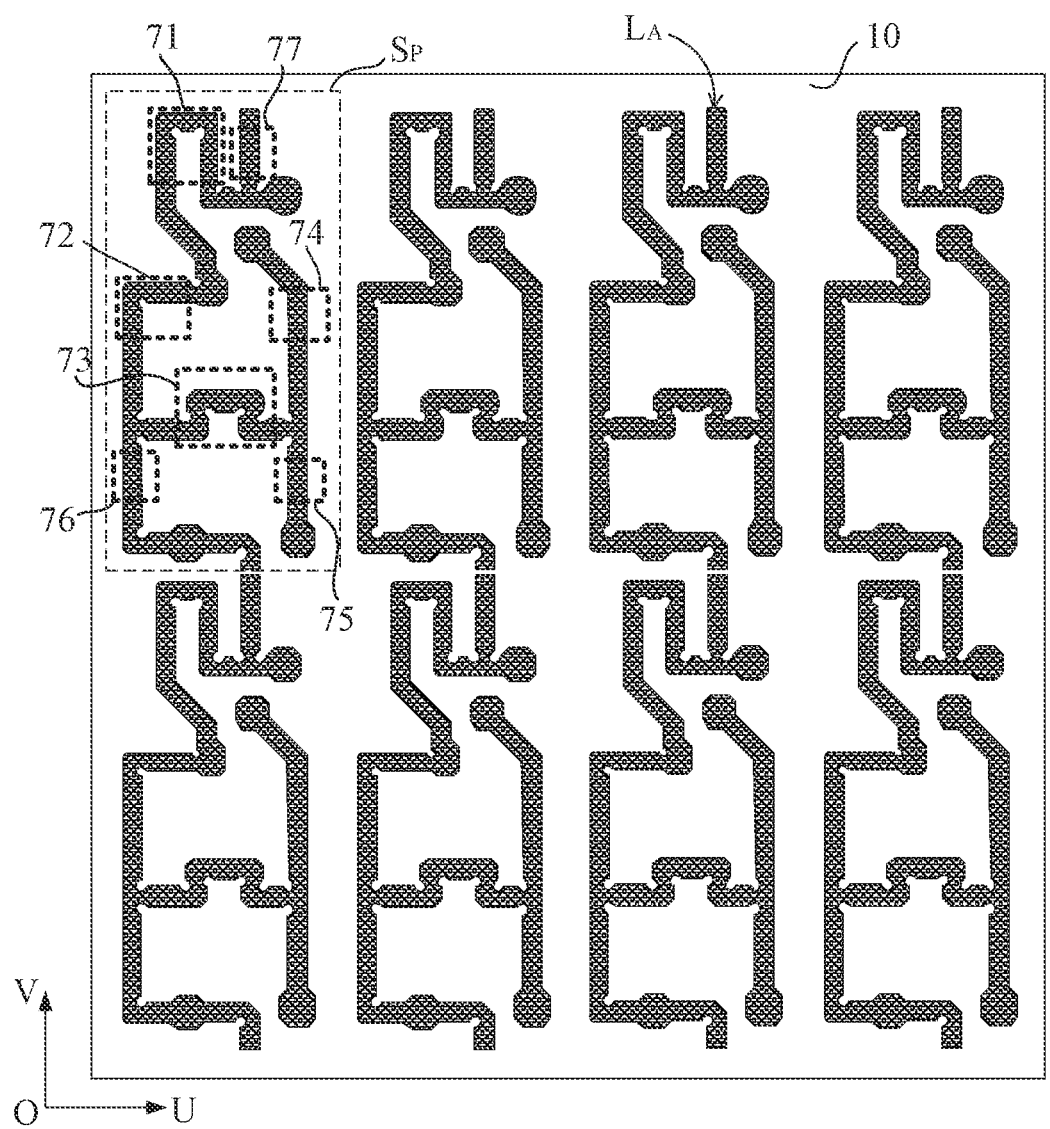
FIGS. 15A to 15F are schematic diagrams showing steps of a manufacturing method of a display substrate, in accordance with some embodiments.
Figure 15B:
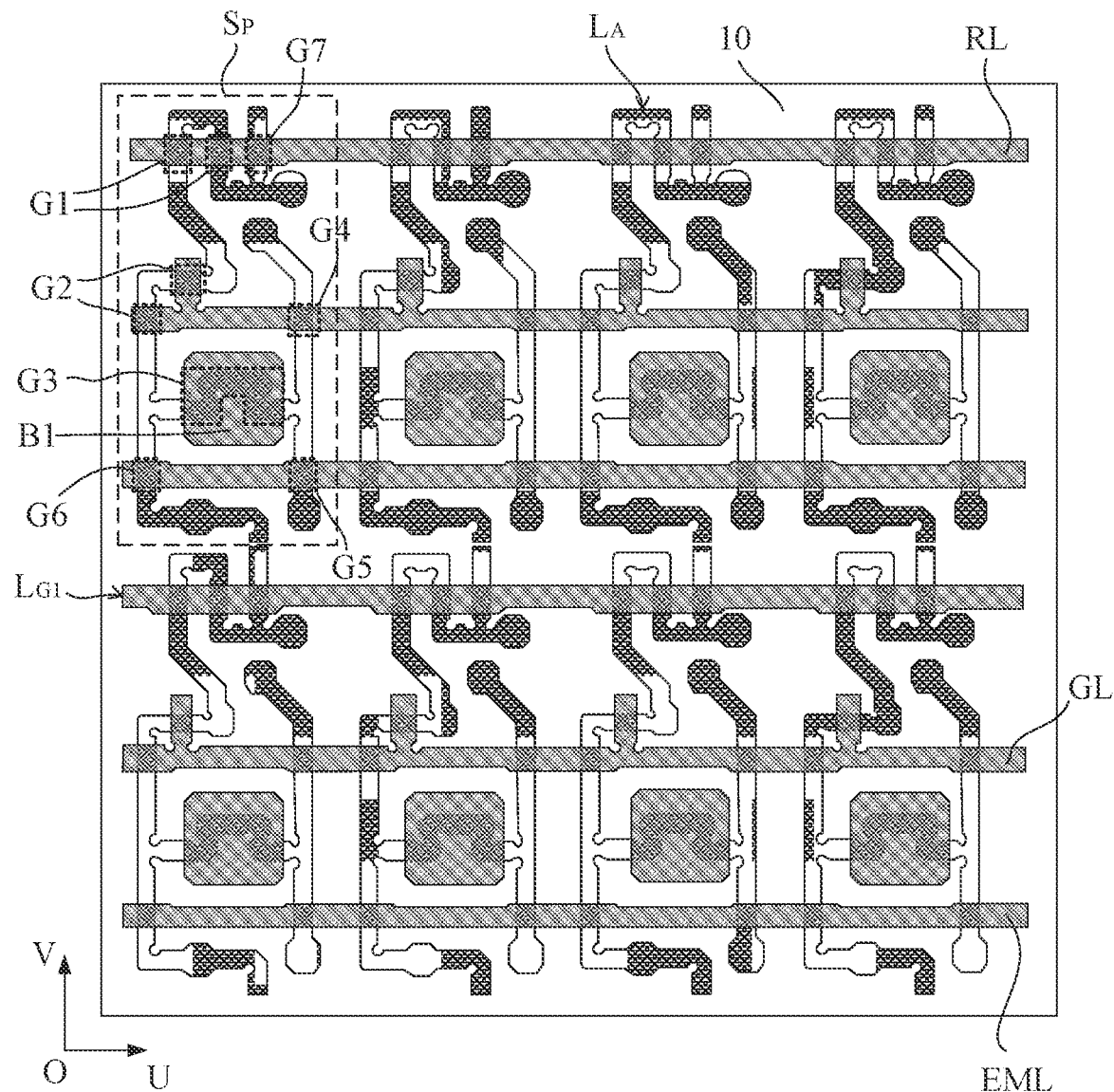
Figure 15C:
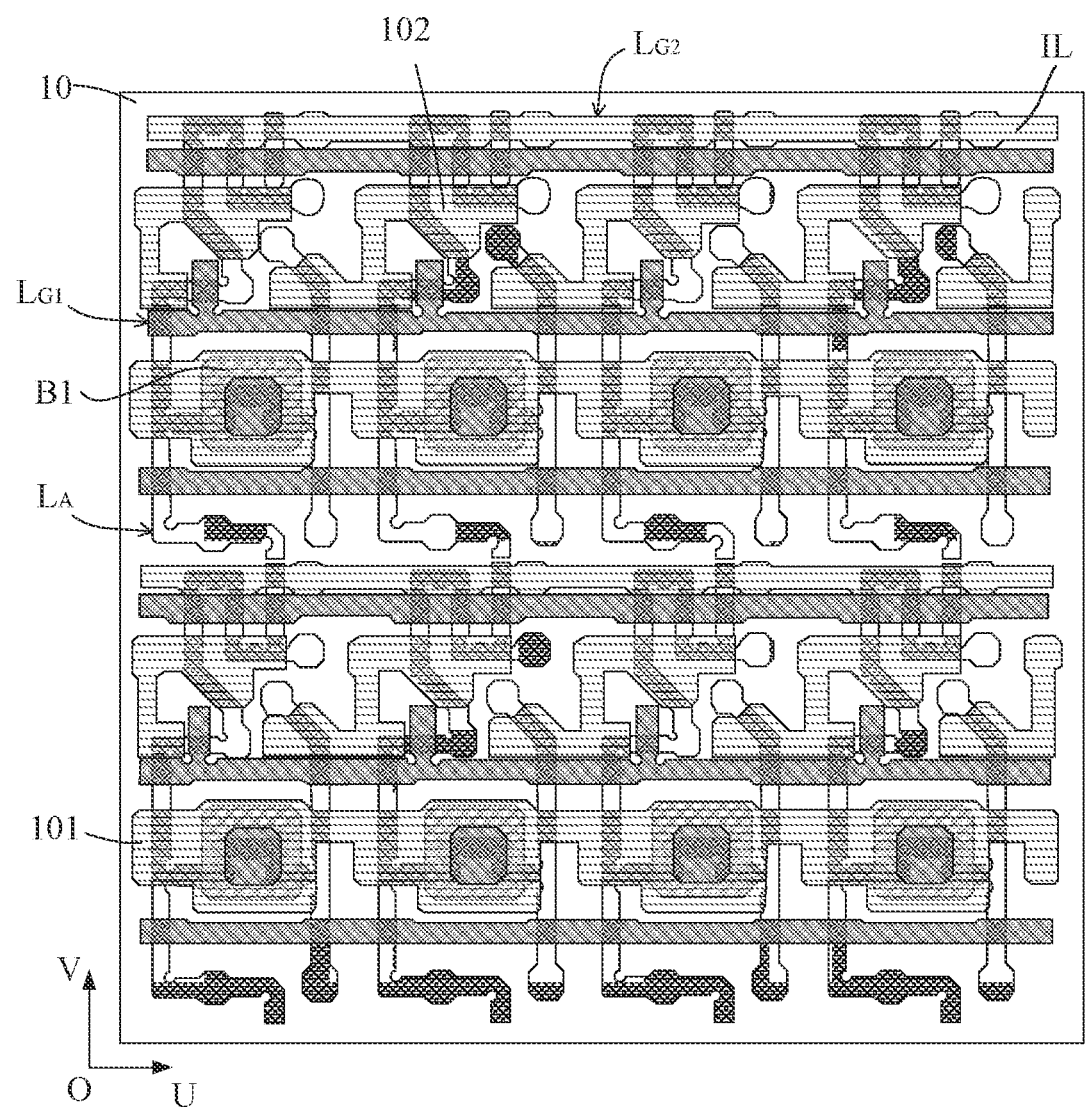
Figure 15D:
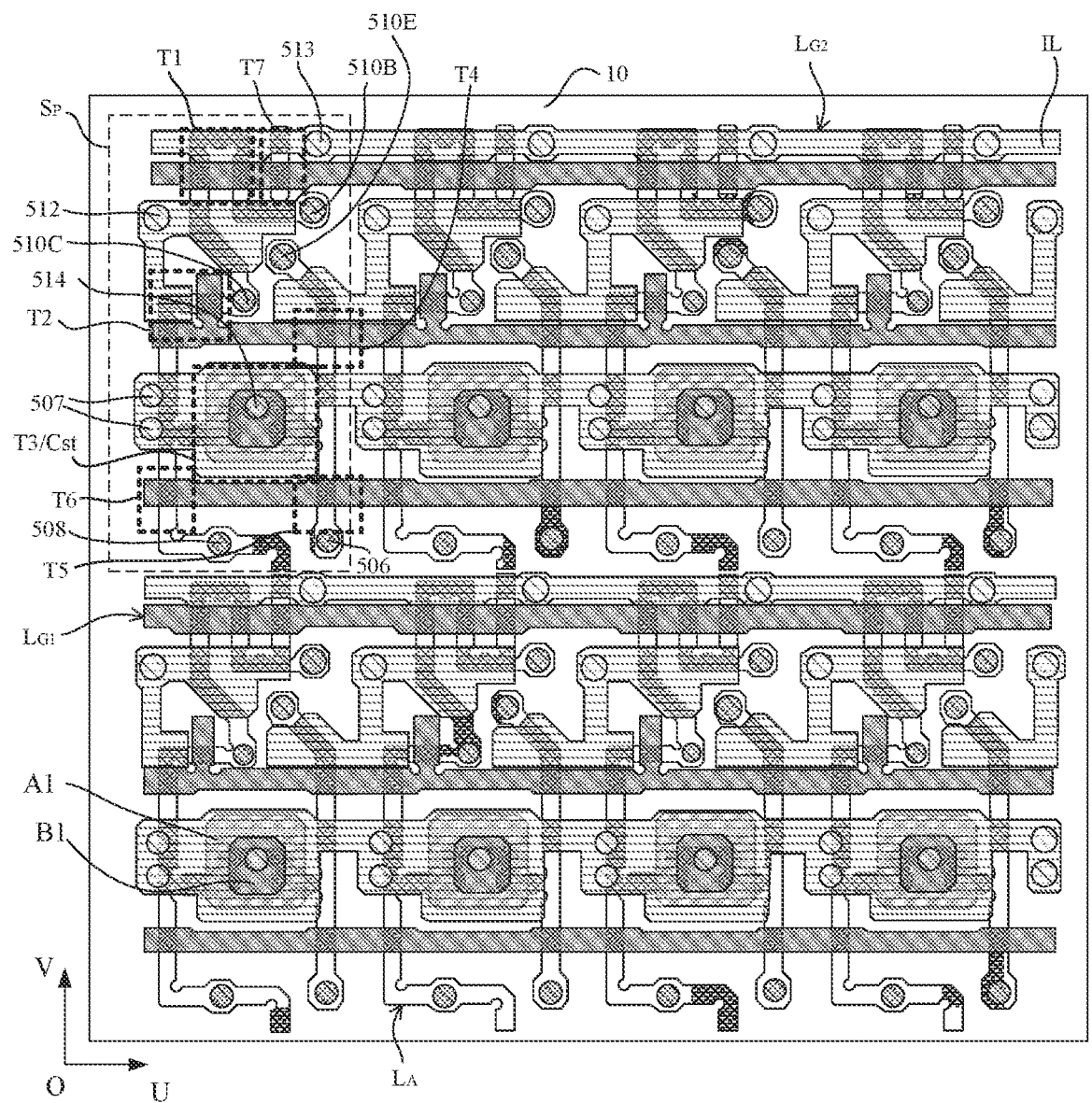
Figure 15E:
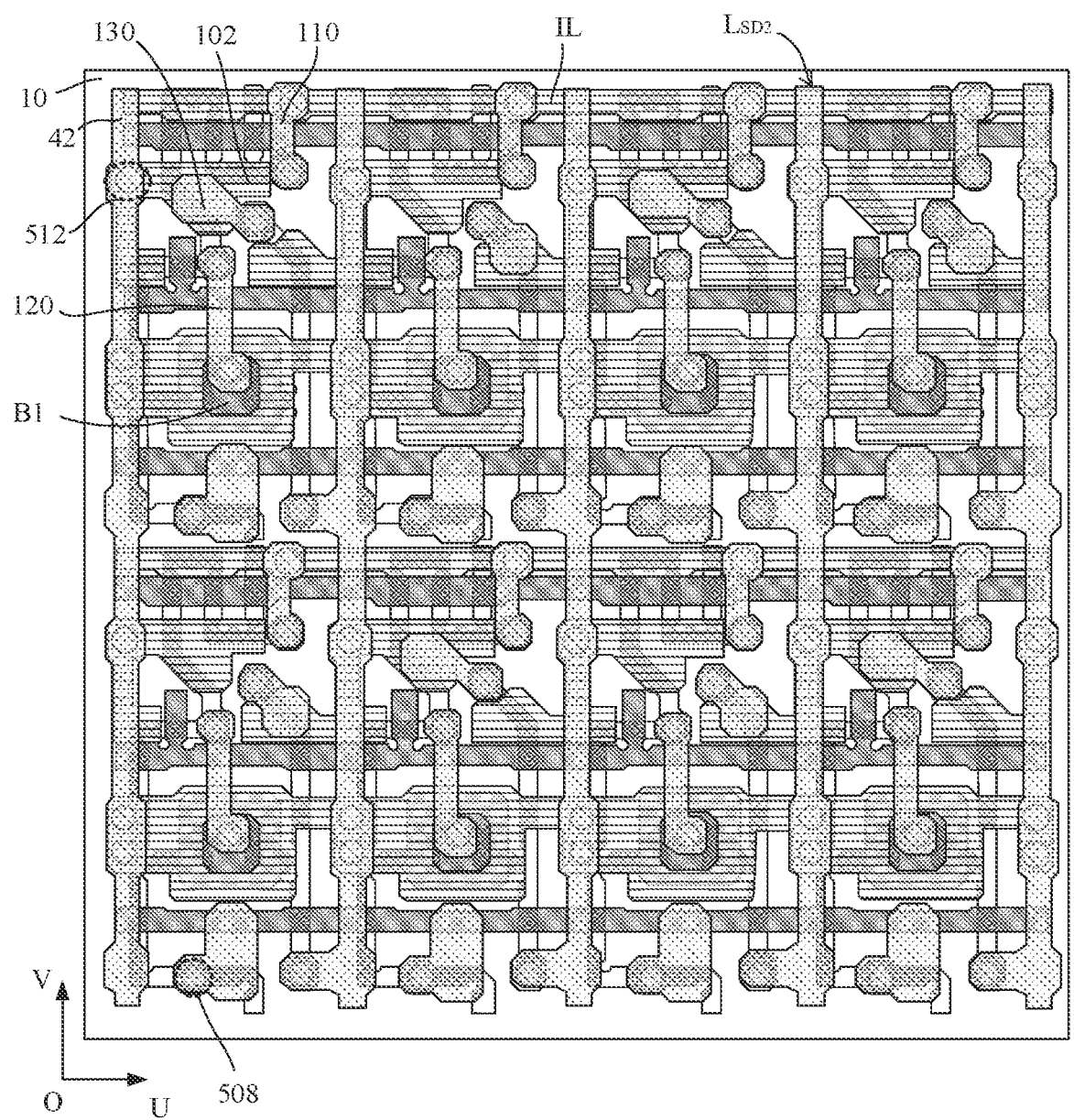

Referring to FIGS. 8A, 15D and 15E, a first end of the third connection portion 110 is electrically connected to the initialization voltage signal line IL through the tenth via hole 513, and a second end of the third connection portion 110 is electrically connected to a first end of the active layer 71 of the first transistor T1 through the seventh via hole 510B, so that the active layer 71 of the first transistor T1 may be electrically connected to the initialization voltage signal line IL. A first end of the fourth connection portion 120 is electrically connected to a second end of the active layer 71 of the first transistor T1 through the seventh via hole 510C, and a second end of the fourth connection portion 120 is electrically connected to the second electrode plate B1 of the capacitor Cst through the eleventh via hole 514, so that the active layer 71 of the first transistor T1 may be electrically connected to the second electrode plate B1 of the capacitor Cst. It will be noted that the second electrode plate B1 of the capacitor Cst and the gate G3 of the third transistor T3 are integrally formed, and a portion of the second electrode plate B1 of the capacitor Cst, whose orthogonal projection on the base 10 is overlapped with the orthogonal projection of the active layer 73 of the third transistor T3, is used as the gate G3 of the third transistor T3. That is, the second end of the active layer 71 of the first transistor T1 is also electrically connected to the gate G3 of the third transistor T3. The gate G1 of the first transistor T1 is electrically connected to the reset signal line RL. Here, a portion of the reset signal line RL, whose orthogonal projection on the base 10 is overlapped with the orthogonal projection of the active layer 71 of the first transistor T1, is used as the gate G1 of the first transistor T1.

A second end of the active layer 72 of the second transistor T2 is electrically connected to the first end of the fourth connection portion 120 through the seventh via hole 510C, so as to be electrically connected to the second electrode plate B1 of the capacitor Cst. A first end of the active layer 72 of the second transistor T2 is electrically connected to a second end of the active layer 73 of the third transistor T3. The gate G2 of the second transistor T2 is electrically connected to the gate line GL.

A first end of the active layer 73 of the third transistor T3 is electrically connected to a second end of the active layer 74 of the fourth transistor T4 and a second end of the active layer 75 of the fifth transistor T5. The second end of the active layer 73 of the third transistor T3 is further electrically connected to a first end of the active layer 76 of the sixth transistor T6.

Referring to FIGS. 8A, 8E and 15D to 15F, a first end of the fifth connection portion 130 is electrically connected to a first end of the active layer 74 of the fourth transistor T4 through the seventh via hole 510E. Referring to FIGS. 8F and 13, eighth via holes 511 are further provided in the first insulating layer IS1. Referring to FIGS. 15D to 15F again, a second end of the fifth connection portion 130 is electrically connected to the first data line 21 or the second data line 22 through the eighth via hole 511. In this way, the first end of the active layer 74 of the fourth transistor T4 may be electrically connected to the first data line 21 or the second data line 22 through the fifth connection portion 130. The gate G4 of the fourth transistor T4 is electrically connected to the gate line GL. Here, a portion of the gate line GL, whose orthogonal projection on the base 10 is overlapped with the orthogonal projection of the active layer 74 of the fourth transistor T4, is used as the gate G4 of the fourth transistor T4.

It will be noted that referring to FIGS. 8E and 8F, the $S_{P1}$ region is a region where the first sub-pixel 31 is located, and the $S_{P2}$ region is a region where the second sub-pixel 32 is located. The plane MN is perpendicular to a plane where the base 10 is located, and the $S_{P1}$ region and the $S_{P2}$ region are substantially symmetrically distributed about the plane MN. Since the first sub-pixel 31 is connected to the first data line 21 located on the left side thereof, and the second sub-pixels 32 is connected to the second data line 22 located on the right side thereof, a connection position of the first sub-pixel 31 and the first data line 21 may be set to be different from a connection position of the second sub-pixel 32 and the second data line. That is, a distribution position of the eighth via hole 511 in the first sub-pixel 31 in the $S_{P1}$ region is different from a distribution position of the eighth via hole 511 in the second sub-pixel 32 in the $S_{P2}$ region.

On this basis, for example, referring to FIGS. 7, 8F and 13, the eighth via hole 511 in the first sub-pixel 31 and the eighth via hole 511 in the second sub-pixel 32 are non-mirror symmetric with respect to the plane MN. In addition, the fifth connection portions 130 in the first sub-pixel 31 and the second sub-pixel 32 may be configured to have different structures, so as to facilitate electrical connection between the fourth transistor T4 and a corresponding data line. In this way, in a case where there is a process deviation in manufacturing, for example, in a case where the eighth via holes 511 and/or the fifth connection portions 130 are shifted to a side, the above structure may be prevented from being doubled in shift amount with respect to another side, which is able to reduce dimensional errors due to process fluctuations.

The gate G5 of the fifth transistor T5 is electrically connected to the light-emitting line EML. Here, a portion of the light-emitting signal line EML, whose orthogonal projection on the base 10 is overlapped with the orthogonal projection of the active layer 75 of the fifth transistor T5, may be used as the gate G5 of the fifth transistor T5.

The gate G6 of the sixth transistor T6 is electrically connected to the light-emitting signal line EML. Here, a portion of the light-emitting signal line EML, whose orthogonal projection on the base 10 is overlapped with the orthogonal projection of the active layer 76 of the sixth transistor T6, may be used as the gate G6 of the sixth transistor T6.

Referring to FIGS. 8A, 15D and 15E, a first end of the active layer 77 of the seventh transistor T7 is electrically connected to the first end of the third connection portion 110 through the tenth via hole 513, so as to be electrically connected to the initialization voltage signal line IL through the third connection portion 110. A second end of the active layer 77 of the seventh transistor T7 is electrically connected to the anode layer 90 of the light-emitting device E. It will be noted that since the display substrate 200 shown in FIG. 7 does not show the anode layer 90, the connection relation between two is not shown. It will be understood that a connection structure of the second end of the active layer 77 of the seventh transistor T7 and the anode layer 90 of the light-emitting device E may be set according to actual needs.

In some embodiments, referring to FIG. 8C, the second gate metal layer $L_{G2}$ further includes shielding portions 102. Referring to FIGS. 8D and 15D, the fifth insulating layer IS5 further includes a plurality of ninth via holes 512. Referring to FIGS. 15D and 15E, in the Sp region where each sub-pixel is located, the shielding portion 102 is electrically connected to the second voltage signal sub-line 42 through the ninth via hole 512. Orthogonal projections of the shielding portions 102 on the base 10 are partially overlapped with the orthogonal projections of the active layer 71 of the first transistor T1, the active layer 72 of the second transistor T2, the active layer 74 of the fourth transistor T4 and the active layer 77 of the seventh transistor T7 on the base 10. In this way, when the display apparatus including the display substrate 200 displays an image, the shielding portion 202 may play a role in shielding light, so as to reduce leakage currents of the above transistors.

Some embodiments of the present disclosure provide the display apparatus including the display substrate 200. Beneficial effects of the display apparatus are the same as the beneficial effects of the display substrate 200, which will not be repeated here.

Referring to FIGS. 7, 13, 15A to 15F, some embodiments of the present disclosure provide a manufacturing method of a display substrate, which may be used to manufacture the display substrate 200. The manufacturing method includes following S110 to S140.

In S110, referring to FIG. 7, a base 10 is provided.

In S120, referring to FIG. 7, pixel driving circuits in a plurality of sub-pixels arranged in an array are formed on the base 10. Here, referring to FIG. 7, each column of sub-pixels includes a plurality of first sub-pixels 31 and second sub-pixels 32. The first sub-pixels 31 and second sub-pixels 32 are alternately arranged in the second direction OV.

In S130, referring to FIG. 15E, a plurality of second voltage signal sub-lines 42 are formed on a side of the pixel driving circuits in the plurality of sub-pixels away from the base 10. Each second voltage signal sub-line 42 is located between two adjacent columns of sub-pixels. It will be noted that an equivalent circuit diagram of the pixel driving circuit in the sub-pixel may be referred to FIG. 11, and the structures of the first transistor T1 to the seventh transistor T7 and the capacitor Cst included therein may be referred to the above related description.

Figure 15F:
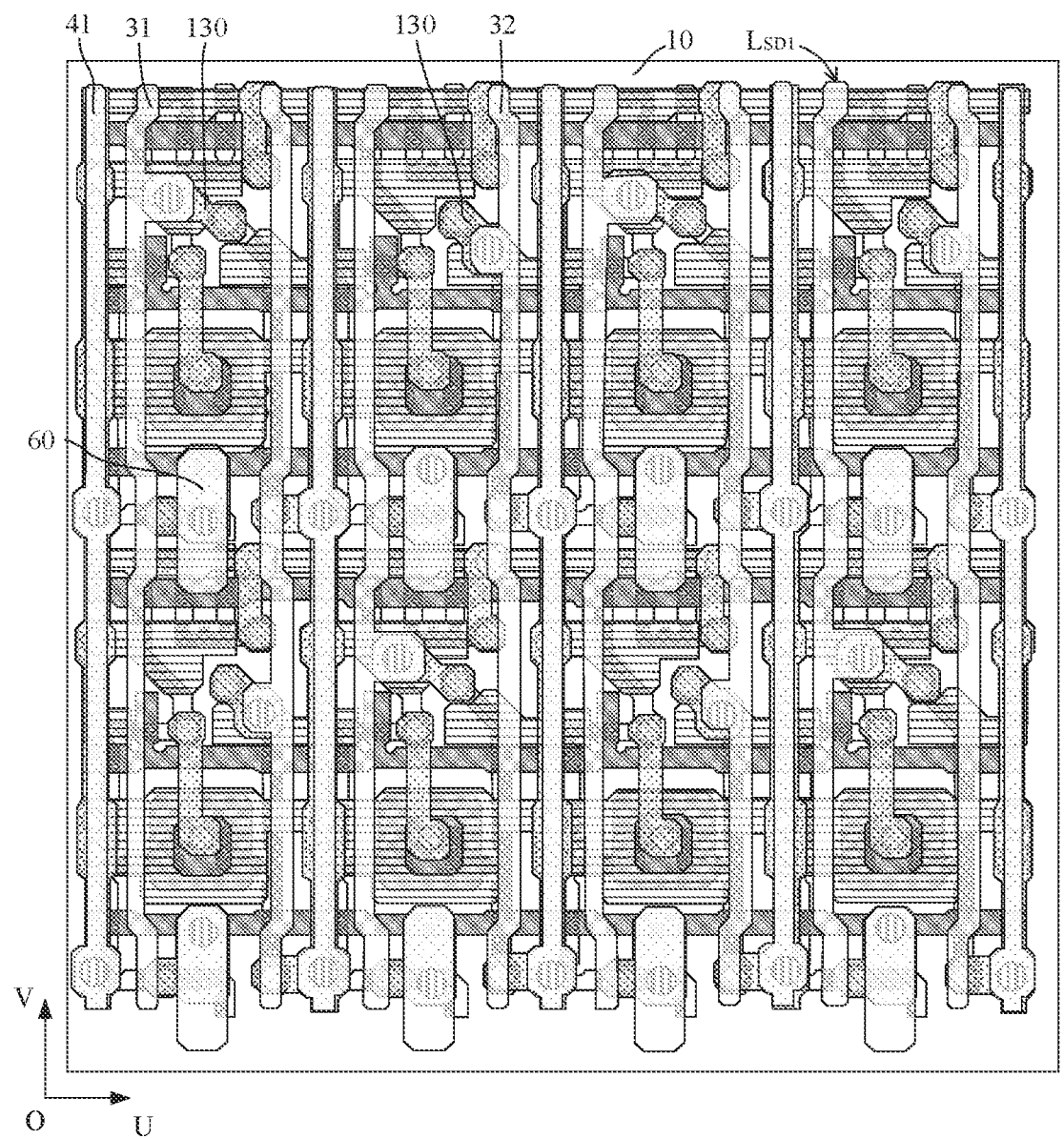

In S140, referring to FIGS. 7 and 15F, a plurality of first data lines 21, a plurality of second data lines 22 and a plurality of first voltage signal sub-lines 41 are formed on a side of the plurality of second voltage signal sub-lines 42 away from the base 10.

Here, the first voltage signal sub-line 41 and the second voltage signal sub-line 42 form the voltage signal line 40. Each voltage signal line 40 is electrically connected to pixel driving circuits in at least one column of sub-pixels. Each voltage signal line 40 is located between the two adjacent columns of sub-pixels. In addition, the first data lines 21 and the second data lines 22 are alternately arranged in the first direction. In the first direction OU, the column of sub-pixels is adjacent to one first data line 21 and one second data line 22, and the first data line 21 and the second data line 22 are located on two sides of the column of sub-pixels. The pixel driving circuit in each first sub-pixel 31 in the column of sub-pixels is electrically connected to the first data line 21 adjacent thereto, and the pixel driving circuit in each second sub-pixel 32 in the column of sub-pixels is electrically connected to the second data line 22 adjacent thereto.

Beneficial effects of the manufacturing method are the same as those of the display substrate 200, which will not be repeated here.

The manufacturing method of the display substrate 200 will be integrally and exemplarily introduced below. In some embodiments, the manufacturing method includes following S210 to S310.

In S210, as shown in FIGS. 9B and 15A, an active layer $L_A$ is formed on the base 10. In the $S_p$ region corresponding to the sub-pixel, the active layer $L_A$ includes the active layer 71 of the first transistor T1, the active layer 72 of the second transistor T2, the active layer 73 of the third transistor T3, the active layer 74 of the fourth transistor T4, the active layer 75 of the fifth transistor T5, the active layer 76 of the sixth transistor T6 and the active layer 77 of the seventh transistor T7.

For example, referring to FIG. 9B, before S210, an inorganic buffer layer 11 is formed on the base 10. The inorganic buffer layer 11 may be of a single-layer structure or a multi-layer laminated structure, e.g., a laminated structure in which inorganic film layers and organic film layers are alternately arranged.

In S220, as shown in FIG. 9B, a third insulating IS3 is formed on a side of the active layer $L_A$ away from the base 10.

In S230, as shown in FIGS. 9B and 15B, a first gate metal layer $L_{G1}$ is formed on a side of the third insulating layer IS3 away from the base 10. In the $S_p$ region, the first gate metal layer $L_{G1}$ includes the gate G1 of the first transistor T1, the gate G2 of the second transistor T2, the gate G3 of the third transistor T3, the gate G4 of the fourth transistor T4, the gate G5 of the fifth transistor T5, the gate G6 of the sixth transistor T6, the gate G7 of the seventh transistor T7, the second electrode plate B1 of the capacitor Cst, the reset signal line RL, the gate line GL and the light-emitting signal line EML.

In S240, as shown in FIG. 9B, a fourth insulating layer IS4 is formed on a side of the first gate metal layer $L_{G1}$ away from the base 10.

For example, referring to FIG. 15D, after S240, the manufacturing method further includes S241. In S241, a plurality of tenth via holes 513 are formed in the fourth insulating layer IS4.

In S250, as shown in FIGS. 9B and 15C, a second gate metal layer $L_{G2}$ is formed on a side of the fourth insulating layer IS4 away from the base 10. The second gate metal layer $L_{G2}$ includes the first electrode plates A1 of the capacitors Cst, the initialization voltage signal lines IL and the shielding portions 102.

In S260, as shown in FIG. 9B, a fifth insulating layer IS5 is formed on a side of the second gate metal layer $L_{G2}$ away from the base 10.

For example, as shown in FIG. 15D, after S260, the manufacturing method includes S261 to S263. In S261, a plurality of fifth via holes 507 and a plurality of ninth via holes 512 are formed in the fifth insulating layer IS5. In S262, a plurality of eleventh via holes 514 are formed in and through the fourth insulating layer IS4 and the fifth insulating layer IS5. In S263, a plurality of fourth via holes 506, a plurality of sixth via holes 508 and a plurality of seventh via holes 510 (including 510B, 510C and 510E) are formed in and through the third insulating layer IS3, the fourth insulating layer IS4 and the fifth insulating layer IS5. That is, the plurality of fourth via holes 506, the plurality of sixth via holes 508 and the plurality of seventh via holes 510 are formed in and through the laminated structure 12.

It will be noted that the sequence of S261 to S263 is not limited, and S261 to S263 may be performed according to a certain sequence, or the three steps may be performed synchronously.

In S270, referring to FIGS. 8E, 9B and 15E, a second source-drain metal layer $L_{SD2}$ is formed on a side of the fifth insulating layer IS5 away from the base 10. The second source-drain metal layer $L_{SD2}$ may include the second voltage signal sub-lines 42, the second connection portions 80, the third connection portions 110, the fourth connection portions 120 and the fifth connection portions 130.

In S280, as shown in FIGS. 8F and 9B, a first insulating layer IS1 is formed on a side of the second source-drain metal layer $L_{SD2}$ away from the base 10.

For example, in a case where the first insulating layer IS1 includes a first planarization layer 502 and a passivation layer 503, S280 includes: forming the first planarization layer 502 on the side of the second source-drain metal layer $L_{SD2}$ away from the base 10, and forming the passivation layer 503 on a side of the first planarization layer 502 away from the base 10, so as to form the first insulating layer IS1.

For example, referring to FIGS. 8F and 13, after S280, the manufacturing method further includes S281. In S281, a plurality of first via holes 501, a plurality of third via holes 505 and a plurality of eighth via holes 511 are formed in the first insulating layer IS1.

In S290, referring to FIGS. 8G, 9B and 15F, a first source-drain metal layer $L_{SD1}$ is formed on a side of the first insulating layer IS1 away from the base 10. The first source-drain metal layer $L_{SD1}$ includes a plurality of first connection portions 60, the first data lines 21, the second data lines 22 and the first voltage signal sub-lines 41.

In S300, referring to FIGS. 8H and 9B, a second insulating layer IS2 is formed on a side of the first source-drain metal layer $L_{SD1}$ away from the base 10.

For example, after S300, the manufacturing method further includes S301. In S301, a plurality of second via holes 504 are formed in the second insulating layer IS2.

In some embodiments, after S300, the manufacturing method further includes S310.

In S310, referring to FIGS. 7, 8H and 9B, anode layers 90 of light-emitting devices E are formed on a side of the second insulating layer IS2 away from the base 10.

It will be noted that structures and functions of the above via holes and film layers may be referred to the foregoing description, and are not repeated here since they have been described in detail in the foregoing description. The manufacturing of the pixel driving circuits in the sub-pixels in S120 of the manufacturing method may be referred to S210 to S250 described above.

In addition, the film layers and the via holes may be formed through a patterning process. The patterning process may include a photolithography process, which refers to a process including film formation (e.g., chemical vapor deposition (CVD) film formation), exposure, development and other processes, and a process that uses a photoresist, a mask, an exposure machine, etc. to form a pattern.

It is worthy to note that throughout the description, any reference to "some embodiments" means that the specific features, structures, or characteristics related to the embodiment(s) are included in at least one embodiment. Therefore, throughout the description, the term "in some embodiments" appearing in various places does not necessarily refer to the same embodiment(s). In addition, the specific features, structures, or characteristics may be combined in one or more embodiments in any suitable manner.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:
a base;
a plurality of first data lines and a plurality of second data lines disposed on the base, the first data lines and the second data lines being alternately arranged in a first direction;
a plurality of sub-pixels disposed on the base and arranged in an array, every two adjacent columns of sub-pixels being provided with one first data line and one second data line therebetween; each column of sub-pixels including a plurality of first sub-pixels and a plurality of second sub-pixels, and the first sub-pixels and the second sub-pixels being alternately arranged in a second direction; the column of sub-pixels being adjacent to one first data line and one second data line in the first direction, the first data line and the second data line being located at two sides of the column of sub-pixels, each first sub-pixel in the column of sub-pixels being electrically connected to the first data line adjacent to the column of sub-pixels, and each second sub-pixel in the column of sub-pixels being electrically connected to the second data line adjacent to the column of sub-pixels;
a plurality of voltage signal lines disposed on the base, an orthogonal projection of each voltage signal line on the base being located between orthogonal projections of the first data line and the second data line between the two adjacent columns of sub-pixels on the base; the voltage signal line being electrically connected to at least one column of sub-pixels; the voltage signal line including a first voltage signal sub-line and a second voltage signal sub-line, the second voltage signal sub-line being disposed on a side of the first voltage signal sub-line proximate to the base and electrically connected to the first voltage signal sub-line, and the first voltage signal sub-line, the first data line and the second data line being arranged in a same layer; and
a first insulating layer disposed between the first voltage signal sub-line and the second voltage signal sub-line, the first insulating layer including a plurality of first via holes; the first voltage signal sub-line being electrically connected to the second voltage signal sub-line through at least one first via hole in the plurality of first via holes, wherein
the first direction is a direction substantially perpendicular to an extending direction of the column of sub-pixels, and the second direction is a direction substantially parallel to the extending direction of the column of sub-pixels; and
in the first data line, the second data line and the first voltage signal sub-line that are located between the two adjacent columns of sub-pixels,
a portion of the first data line adjacent to the first via hole bends in a direction away from the first via hole to form a first bent portion;
a portion of the second data line adjacent to the first via hole bends in a direction away from the first via hole to form a second bent portion;
the first bent portion and the second bent portion are opposite to each other to form an accommodating region;
the first voltage signal sub-line includes a conductive portion passing through the first via hole, and the conductive portion is located in the accommodating region.

2. The display substrate according to claim 1, wherein each row of sub-pixels include a plurality of first sub-pixels and a plurality of second sub-pixels, and the first sub-pixels and the second sub-pixels are alternately arranged in the first direction.

3. The display substrate according to claim 1, wherein in the first direction, a dimension of the conductive portion is greater than a width of a portion of the first voltage signal sub-line other than the conductive portion, and a dimension of the accommodating region is greater than a distance between a portion of the first data line other than the first bent portion and a portion of the second data line other than the second bent portion between the two adjacent columns of sub-pixels.

4. The display substrate according to claim 1, wherein in the first direction, a distance between the conductive portion and the first bent portion is substantially equal to a distance between the conductive portion and the second bent portion.

5. The display substrate according to claim 1, wherein in the first direction, a distance between the conductive portion and the first bent portion is substantially equal to a distance between a portion of the first data line other than the first bent portion and a portion of the first voltage signal sub-line other than the conductive portion; and/or
in the first direction, a distance between the conductive portion and the second bent portion is substantially equal to a distance between a portion of the second data line other than the second bent portion and a portion of the first voltage signal sub-line other than the conductive portion.

6. The display substrate according to claim 1, further comprising first connection portions, wherein in the first data line and the second data line that are adjacent to the column of sub-pixels and located on the two sides of the column of sub-pixels in the first direction, the first bent portion and the second bent portion are provided with a first connection portion therebetween, and the first connection portion and the first voltage signal sub-line are arranged in a same layer.

7. The display substrate according to claim 6, further comprising:
anode layers disposed on a side of the first connection portion away from the base; and
first light-emitting control transistors disposed on the base, a first light-emitting control transistor in the first light-emitting control transistors including an active layer including a first conductor portion; the first connection portion being electrically connected to the first conductor portion and an anode layer in the anode layers.

8. The display substrate according to claim 7, further comprising:
second connection portions, a second connection portion in the second connection portions being disposed between the active layer of the first light-emitting control transistor and the first connection portion, and arranged in a same layer as the second voltage signal sub-line; the second connection portion being electrically connected to the first conductor portion and the first connection portion.

9. The display substrate according to claim 8, wherein in the second direction, a dimension of the first connection portion is greater than or equal to both a length of the first bent portion and a length of the second bent portion.

10. The display substrate according to claim 9, wherein an orthogonal projection of the first connection portion on the base and an orthogonal projection of the second connection portion on the base have an overlapped region therebetween.

11. The display substrate according to claim 3, wherein the first via hole is located between two adjacent rows of sub-pixels and between two adjacent columns of sub-pixels.

12. The display substrate according to claim 7, wherein in the second direction, maximum dimensions of two portions of the first connection portion located on two sides of a line connecting centers of two first via holes adjacent to the first connection portion are substantially equal.

13. The display substrate according to claim 1, wherein each sub-pixel includes:
a second light-emitting control transistor, the second voltage signal sub-line being electrically connected to an active layer of the second light-emitting control transistor; and
a capacitor including a first electrode plate located on a side of a film layer where the second voltage signal sub-line is located proximate to the base and a second electrode plate located on a side of the first electrode plate proximate to the base; the second voltage signal sub-line being further electrically connected to the first electrode plate.

14. The display substrate according to claim 13, wherein in each row of sub-pixels, first electrode plates of capacitors in a plurality of sub-pixels are electrically connected to each other, so as to form a plurality of auxiliary conductive strips extending in the first direction; orthogonal projections of the plurality of auxiliary conductive strips and a plurality of first voltage signal sub-lines on the base intersect to form a grid structure.

15. A display apparatus, comprising the display substrate according to claim 1.

16. A manufacturing method of a display substrate, comprising:
providing a base;
forming pixel driving circuits in a plurality of sub-pixels arranged in an array on the base; each column of sub-pixels including a plurality of first sub-pixels and a plurality of second sub-pixels, and the first sub-pixels and the second sub-pixels being alternately arranged in a second direction;
forming a plurality of second voltage signal sub-lines on a side of the pixel driving circuits in the plurality of sub-pixels away from the base, each second voltage signal sub-line being located between two adjacent columns of sub-pixels;
forming a plurality of first data lines, a plurality of second data lines and a plurality of first voltage signal sub-lines on a side of the plurality of second voltage signal sub-lines away from the base; a first voltage signal sub-line and a second voltage signal sub-line forming a voltage signal line, and each voltage signal line being electrically connected to pixel driving circuits in at least one column of sub-pixels; each voltage signal line being located between the two adjacent columns of sub-pixels; the first data lines and the second data lines being alternately arranged in a first direction; the column of sub-pixels being adjacent to one first data line and one second data line in the first direction, the first data line and the second data line being located on two sides of the column of sub-pixels, a pixel driving circuit in each first sub-pixel in the column of sub-pixels being electrically connected to the first data line adjacent to the column of sub-pixels, and a pixel driving circuit in each second sub-pixel in the column of sub-pixels being electrically connected to the second data line adjacent to the column of sub-pixels, wherein
the first direction is a direction substantially perpendicular to an extending direction of the column of sub-pixels, and the second direction is a direction substantially parallel to the extending direction of the column of sub-pixels;
the method further comprising:
forming a first insulating layer disposed between the first voltage signal sub-line and the second voltage signal sub-line; the first insulating layer including a plurality of first via holes; the first voltage signal sub-line being electrically connected to the second voltage signal sub-line through at least one first via hole in the plurality of first via holes; wherein in the first data line, the second data line and the first voltage signal sub-line that are located between the two adjacent columns of sub-pixels,
a portion of the first data line adjacent to the first via hole bends in a direction away from the first via hole to form a first bent portion;
a portion of the second data line adjacent to the first via hole bends in a direction away from the first via hole to form a second bent portion;
the first bent portion and the second bent portion are opposite to each other to form an accommodating region;
the first voltage signal sub-line includes a conductive portion passing through the first via hole, and the conductive portion is located in the accommodating region.

* * * * *